(12) United States Patent
Hori

(10) Patent No.: US 7,280,053 B2
(45) Date of Patent: *Oct. 9, 2007

(54) ENCODER, DECODER, AND DATA TRANSFER SYSTEM

(75) Inventor: Yoshihiko Hori, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/414,309

(22) Filed: May 1, 2006

(65) Prior Publication Data

US 2006/0192700 A1  Aug. 31, 2006

Related U.S. Application Data

(62) Division of application No. 10/716,678, filed on Nov. 20, 2003, now Pat. No. 7,064,689.

(30) Foreign Application Priority Data

Nov. 20, 2002  (JP) .............................. 2002-336685

(51) Int. Cl.
  *H03M 7/00* (2006.01)
(52) U.S. Cl. .......................................... 341/51; 341/50
(58) Field of Classification Search .......... 341/95–110; 365/219; 370/503; 375/212; 702/119; 710/57

See application file for complete search history.

(56) References Cited

U.S. PATENT DOCUMENTS

| | | | |
|---|---|---|---|
| 4,158,107 A | 6/1979 | Nicholas | |
| 4,369,504 A | 1/1983 | Hanmura | |
| 4,620,311 A | 10/1986 | Schouhamer Immink | |
| 4,674,064 A | 6/1987 | Vaughn | |
| 4,864,303 A | 9/1989 | Ofek | |
| 4,901,076 A | 2/1990 | Askin et al. | |
| 5,259,000 A | 11/1993 | Kojima et al. | |
| 5,576,980 A | 11/1996 | Whetsel | |
| 5,598,156 A | 1/1997 | Hush et al. | |
| 5,648,776 A | 7/1997 | Widmer | |
| 5,825,824 A | 10/1998 | Lee et al. | |
| 5,974,464 A | 10/1999 | Shin et al. | |
| 5,982,309 A | 11/1999 | Xi et al. | |
| 5,999,571 A | 12/1999 | Shin et al. | |

(Continued)

FOREIGN PATENT DOCUMENTS

JP  6-503217  4/1994

(Continued)

*Primary Examiner*—Lam T. Mai
(74) *Attorney, Agent, or Firm*—Young & Thompson

(57) ABSTRACT

An encoder suppresses effectively the high-frequency components of data to be transmitted by decreasing the changing points of serial data, thereby suppressing EMI. A changing-point counter counts changing points of n-bit data (n: a positive integer) to generate a counting result, where values of adjoining bits change at each of the changing points. The changing-point counter outputting a discrimination bit which is true when the counting result exceeds a predetermined value. A code converter converts the n-bit data in such a way that bits of the n-bit data located at predetermined positions are inverted when the discrimination bit is true. A parallel-to-serial converter converts (n+1)-bit data to a (n+1)-bit serial code, the (n+1)-bit data being generated by adding the discrimination bit to an output of the code converter.

2 Claims, 16 Drawing Sheets

U.S. PATENT DOCUMENTS

| | | |
|---|---|---|
| 6,041,370 A | 3/2000 | Guyt |
| 6,052,073 A | 4/2000 | Carr et al. |
| 6,232,895 B1 | 5/2001 | Djupsjobacka et al. |
| 6,513,893 B2 * | 2/2003 | Esaki et al. .................... 347/9 |
| 6,693,918 B1 | 2/2004 | Dallabetta et al. |
| 6,704,290 B1 * | 3/2004 | Ushirozawa ................ 370/252 |
| 6,707,399 B1 | 3/2004 | Wang et al. |

FOREIGN PATENT DOCUMENTS

| | | |
|---|---|---|
| JP | 8-095686 | 4/1996 |
| JP | 10-171567 | 6/1998 |
| JP | 11-500887 | 1/1999 |
| JP | 11-506289 | 6/1999 |
| JP | 2000-507755 | 6/2000 |
| JP | 2001-36590 | 2/2001 |
| WO | WO97/13348 | 4/1997 |

* cited by examiner

CHANGING POINT CHANGE AFTER CONVERSION TO 9-BIT DATA

CHANGING POINT CHANGE INCLUDING DATA BOUNDARIES IN FIRST EMBODIMENT

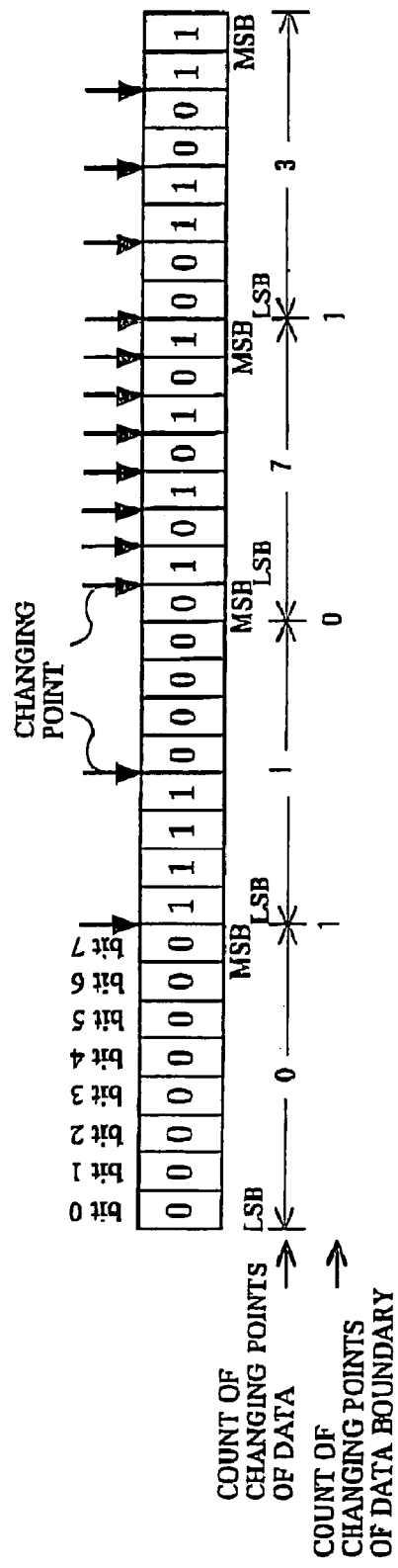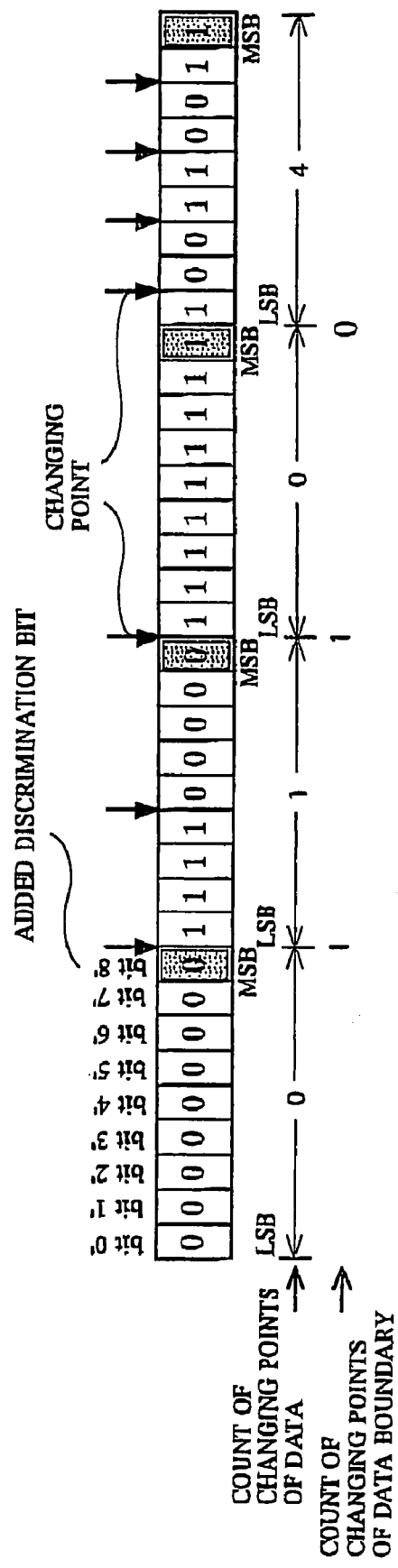

CHANGING POINT CHANGE INCLUDING DATA BOUNDARIES IN FOURTH EMBODIMENT

CHANGING POINT CHANGE OF 10-BIT DATA

FIG. 17
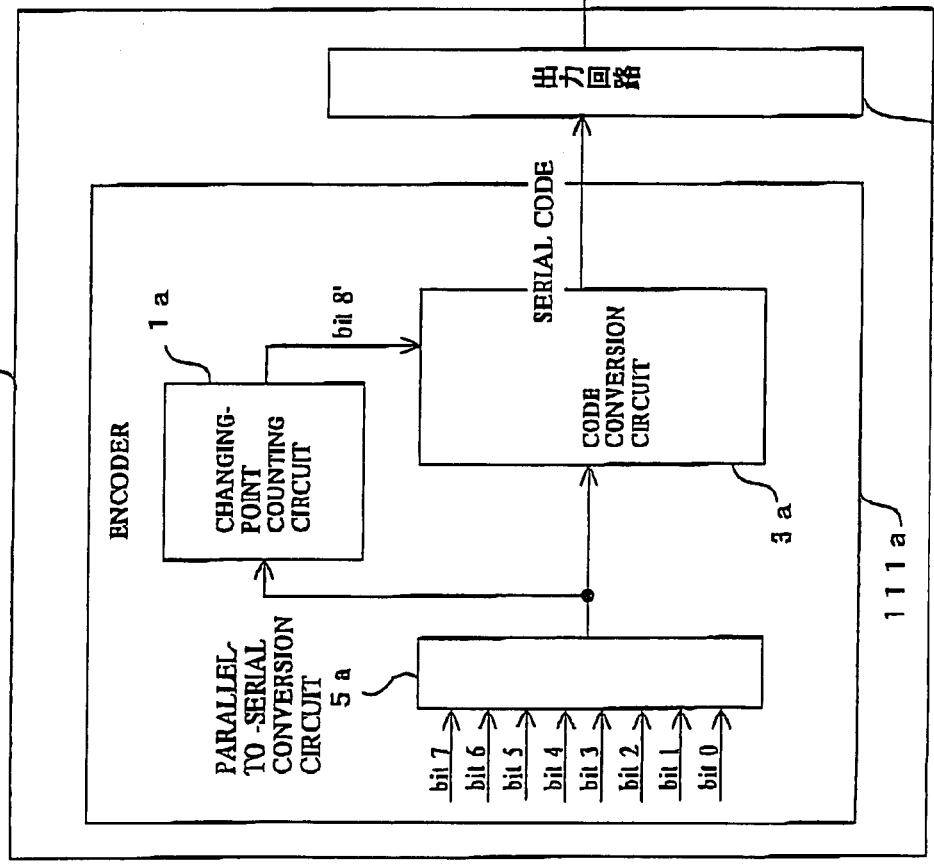
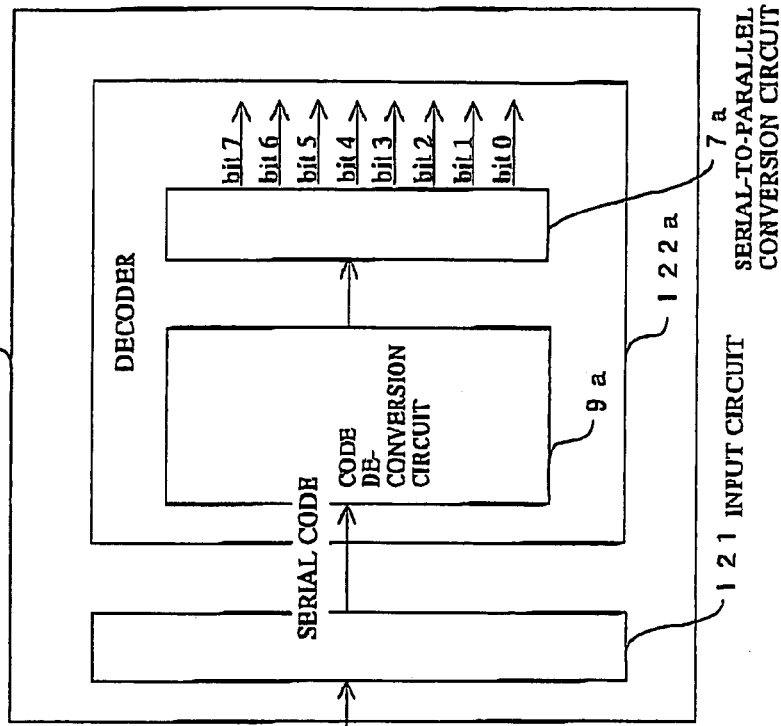

ND DATA
ENCODER, DECODER, AND DATA TRANSFER SYSTEM

BACKGROUND OF THE INVENTION

1. Field of the Invention

The present invention relates to an encoder for converting parallel data to serial data, a decoder for converting serial data to parallel data, and a data transfer system for transferring serial data. More particularly, the invention relates to an encoder, a decoder, and a data transfer system that reduce the high-frequency components of data to be transferred by decreasing the changing points of serial data, thereby effectively suppressing EMI (Electro-Magnetic Interference).

2. Description of the Related Art

With data transfer systems for transferring serial data, it has been an important problem that how we effectively suppress "EMI", i.e., an electromagnetic effect induced by radiation of electromagnetic wave. Electro-magnetic energy, which is a main cause of EMI, is generated by high-frequency components of data to be transferred.

In recent years, to cope with the demand of higher data transmission, the data transfer rate has been becoming higher. In this case, the duration applied to an individual bit of serial data (i.e., the pulse width of electric signal of serial data) is narrowed still more and as a result, the curve of the signal is sharpened at changing points where the values of the adjoining bits of the data change. This means that the high-frequency components of the signal or data increase, making the EMI-inducing problem more conspicuous.

To suppress the high-frequency components of the signal or data to be transferred as the cause of EMI, some countermeasures have been already developed and disclosed, where the changing points of serial data to be transferred are decreased.

FIG. 1 shows a functional block diagram of a prior-art data transfer system for transferring serial data, where the changing points of serial data to be transferred are decreased using look-up tables. The prior-art data transfer system of FIG. 1 may be referred as the "first prior-art data transfer system" below.

As shown in FIG. 1, the data transfer system comprises a data transmission circuit 210 and a data reception circuit 220. In this system, a discrimination bit is added to 8-bit data (bit 0 to bit 7) to be transferred, forming 9-bit data (bit 0' to bit 8'). The 9-bit data thus formed is used as the "transfer unit" in the data transfer operation.

The data transmission circuit 210 comprises an encoder 211 and an output circuit 212. The encoder 211 has a look-up table 213 and a parallel-to-serial conversion circuit 214. In the look-up table 213, 9-bit data are stored in advance. The 9-bit data are generated in the following way. Specifically, 8-bit data to be transferred (i.e., original 8-bit data) are respectively modified in such a way as to decrease their changing points, thereby forming modified 8-bit data. Thereafter, a discrimination bit for showing the fact that the modification was applied to each of the modified 8-bit data thus formed, thereby forming the 9-bit data. The 9-bit data are then stored in the table 213.

By accessing the look-up table 213 using original 8-bit data (bit 0 to bit 7) as the address, the 9-bit data (bit 0' to bit 8') having the decreased changing points corresponding to the original 8-bit data is obtained. The 9-bit data thus obtained is converted to a serial code by the parallel-to-serial conversion circuit 214.

The output circuit 212, which comprises an output buffer and a control circuit for controlling the data transmission, outputs the serial code sent form the parallel-to-serial conversion circuit 214 to a transmission channel or line 230. As a countermeasure against EMI, a process for making differential-pair signal lines and/or a filtering process may be additionally carried out.

On the other hand, the data reception circuit 220 comprises an input circuit 221 and a decoder 222. The input circuit 221, which has an input buffer and a control circuit for controlling the data reception operation, receives the serial code transmitted by way of the transmission line 230. As a countermeasure against EMI, an inverse-filtering process and/or a process for making a single signal line may be additionally carried out.

In the look-up table 224 of the decoder 222, 8-bit data for returning the 9-bit data generated by the encoder 211 of the data transmission circuit 210 to the original 8-bit data based on the discrimination bit are stored in advance.

The serial code received by the input circuit 221 is converted to a 9-bit parallel data (bit 0' to bit 8') by the serial-to-parallel conversion circuit 223. By accessing the look-up table 224 using the 9-bit parallel data thus obtained as the address, the original 8-bit data (bit 0 to bit 7) is obtained.

The Japanese Non-Examined Patent Publication No. 2001-36590 published in 2001 discloses a serial data transmission system, which may be referred as the "second prior-art data transfer system" below.

The serial data transmission system of the Publication No. 2001-36590 has an object to suppress the high-frequency components of a signal or data to be transferred as the cause of, EMI even if the data transfer rate is raised. In this system, a signal or data to be transferred is converted (concretely, the bits of the signal or data to be transferred are permuted) by a conversion means in such a way as to decrease its changing points, thereby forming a converted data or signal. Thereafter, conversion data for showing how the signal or data to be transferred was converted by the conversion means is added to the converted data or signal. Subsequently, the converted data or signal to which the conversion data was added is transmitted by a transmission means.

With the first prior-art data transfer system, however, the look-up tables 213 and 224 are provided in the data transmission circuit 210 and the data reception circuit 220, respectively. Therefore, there is an advantage that the degree of freedom for data conversion in the encoder 211 and the decoder 222 is high. However, these tables 213 and 224 necessitate large storage capacities, respectively. Therefore, there is a disadvantage that the circuit scale of the system is large and the fabrication cost thereof is high.

For example, a storage capacity of [9 (bits)×256 (words) (=8 bits)] is required for the look-up table 213 of the data transmission circuit 210. A storage capacity of [8 (bits)×512 (words) (=9 bits)] is required for the look-up table 224 of the data reception circuit 220. If the changing points formed at the boundaries between the adjoining data to be transmitted are considered, a storage capacity of [9 (bits)×512 (words) (=9 bits)] is required for the look-up table 213 of the data transmission circuit 210.

With the second prior-art data transfer system, the conversion of the signal or data to be transferred by the conversion means is permutation of the bits of the signal or data to be transferred, which is a complicated process. Therefore, there is a disadvantage that a heavy load is applied to the encoder and decoder.

Since the conversion data showing how the signal or data was converted is added to the converted data or signal, the bit length of the transfer unit is increased. Thus, if the conversion data is complicated, there is another disadvantage that the transfer frequency needs to be raised and as a result, effective EMI suppression may be prevented.

Moreover, due to the changing points of the conversion data themselves and those generated at the boundaries between the data to be transmitted and the conversion data, there is a possibility that the count of the changing points is increased compared with that before the conversion operation, if the conversion data added is particular one. In this case, the high-frequency components as the cause of EMI are unable to be suppressed, which is a still another disadvantage.

SUMMARY OF THE INVENTION

The present invention was created through the consideration about the above-described disadvantages or problems.

Accordingly, an object of the present invention is to provide an encoder, a decoder, and a data transfer system that suppress effectively the high-frequency components of data to be transmitted by decreasing the changing points of serial data, thereby suppressing EMI.

Another object of the present invention is to provide an encoder, a decoder, and a data transfer system that reduce the necessary circuit components or elements by decreasing the changing points of serial data with a simpler process, thereby suppressing EMI at low cost.

Still another object of the present invention is to provide an encoder, a decoder, and a data transfer system that reduce the changing points of data to be transferred and data added thereto, thereby ensuring the suppression of EMI.

A further object of the present invention is to provide an encoder, a decoder, and a data transfer system that reduce not only the changing points of data to be transferred but also the changing points generated at the boundary between adjoining data to be transferred, thereby ensuring the suppression of EMI.

The above objects together with others not specifically mentioned will become clear to those skilled in the art from the following description.

According to a first aspect of the present invention, an encoder is provided. This encoder comprises:

a changing-point counter for counting changing points of n-bit data (n: a positive integer) to generate a counting result, where values of adjoining bits change at each of the changing points;

the changing-point counter outputting a discrimination bit which is true when the counting result exceeds a predetermined value;

a code converter for converting the n-bit data in such a way that bits of the n-bit data located at predetermined position are inverted when the discrimination bit is true; and a parallel-to-serial converter for converting (n+1)-bit data to a (n+1)-bit serial code, the (n+1)-bit data being generated by adding the discrimination bit to an output of the code converter.

Here, the properties of the changing points are summarized.

[Property 1]

The maximum value Nmax of the count of the changing points of n-bit data is (n−1), i.e., Nmax=(n−1).

[Property 2]

When the count of the changing points of n-bit data p is defined as Np, and n-bit data generated by alternately inverting the constituent bits of the n-bit data p is defined as q, the count Nq of the n-bit data q is given by the following equation.

$$Nq=(n-1)-Np.$$

For example, if n=8, the maximum value Nmax of 8-bit data is 7. The 8-bit data p having the Nmax of 7 are "10101010" and "01010101". With the 8-bit data p of 01001001, Np=5. However, with the 8-bit data q of 00011100, which is generated by alternately inverting the constituent bits of the 8-bit data p, Nq=(n−1)−Np=7−5=2.

From the Property 2, the following are found.

The n-bit data q generated by alternately inverting the constituent bits of the n-bit data having (n−1) changing points has a changing point count of (n−1)−(n−1)=0.

The n-bit data q generated by alternately inverting the constituent bits of the n-bit data having (n−2) changing points has a changing point count of (n−1)−(n−2)=1.

The n-bit data q generated by alternately inverting the constituent bits of the n-bit data having (n−3) changing points has a changing point count of (n−1)−(n−3)=2.

Similarly, the n-bit data q generated by alternately inverting the constituent bits of the n-bit data having two changing points has a changing point count of (n−1)−2=n−3.

The n-bit data q generated by alternately inverting the constituent bits of the n-bit data having one changing point has a changing point count of (n−1)−1=n−2.

The n-bit data q generated by alternately inverting the constituent bits of the n-bit data having no changing point has a changing point count of (n−1)−0=n−1.

As seen from these relationships, when the predetermined value M for the changing points counter is set at a largest integer equal to or less than (½)×(n−1), and the counting result of the n-bit data exceeds the predetermined value M (the discrimination bit is true), the changing point count of the output of the code converter (i.e., the converted n-bit data) is reduced to M at most.

Therefore, it is preferred that even- or odd-numbered bits of the n-bit data are inverted by the code converter when the discrimination bit is true. It is preferred that the predetermined value M is a largest integer equal to or less than (½)×(a bit number of the n-bit data−1).

However, the parallel-to-serial converter converts (n+1)-bit data to a (n+1)-bit serial code, where the (n+1)-bit data is generated by adding the discrimination bit to an output (i.e., the converted n-bit data) of the code converter. Thus, the changing point count of the (n+1)-bit serial code outputted from the encoder is (M+1) or (M+2) at most. This means that changing points may be additionally generated at the front and rear boundaries of the discrimination bit added. Therefore, if the discrimination bit is located at a point other than the LSB and MSB of the (n+1)-bit serial code, the changing point count of the (n+1)-bit serial code is (M+2) at most. If the discrimination bit is located at the LSB or MSB of the (n+1)-bit serial code, the changing point count of the (n+1)-bit serial code is (M+1) at most.

Accordingly, to reduce the changing point count of the (n+1)-bit serial code, it is preferred that the discrimination bit is located at the LSB or MSB of the (n+1)-bit serial code. In this case, there is an additional advantage that the changing point count of the (n+1)-bit serial code is reduced to (M+1) at most. In addition, the first bit of the (n+1)-bit serial code may be the LSB or MSB. The last bit of the (n+1)-bit serial code may be the LSB or MSB.

When the (n+1)-bit serial code generated by the encoder according to the first aspect is serially transferred, changing points may be generated at its front or rear boundary.

Therefore, the changing point count of the (n+1)-bit serial code per substantial transfer unit is increased by one, resulting in (M+2) at most.

To avoid this disadvantage, it is preferred that the detection target data of the changing-point counter is expanded by one bit. Specifically, the changing-point counter conducts its counting operation for (n+1)-bit data generated by adding a last bit of an immediately preceding n-bit serial code the encoder has dealt to the n-bit serial data. In this case, it is preferred that the predetermined value M' of the changing-point counter is a largest integer equal to or less than (n/2). Thus, the changing point count of the (n+1)-bit serial code per substantial transfer unit is suppressed to (M'+1) at most.

As explained above, if the discrimination bit is located at the first or last bit of the (n+1)-bit serial code, the changing point count of the (n+1)-bit serial code is (M+1) [or (M'+1)] at most.

Next, a method of suppressing the generation of the changing point at the boundary between the n-bit data and the discrimination bit is explained below, where the changing point count of the n-bit data can be kept at M [or M'] at most.

First, the changing point count of the (n+1)-bit serial code becomes (M+1) [or (M'+1)] only when the counting result of the changing-point counter is equal to M [or M']. In this case, the counting result does not exceed the predetermined value M [or M'] and therefore, the discrimination bit is false. Therefore, when the discrimination bit is located at the first or last bit of the (n+1)-bit serial code, a changing point is generated at the boundary between the first or last bit of the n-bit data and the discrimination bit only if the first or last bit of the n-bit data is true.

On the other hand, if the bit number n [or (n+1)] of the detection target in the changing-point counter is odd, and the counting result of the changing point counter is equal to M [or M'], the changing-point count does not change regardless of the conversion by the code converter.

Accordingly, in the case where the first or last bit of the n-bit data is not a conversion target bit of the code converter, if the counting result of the counter is equal to M [or M'] and at the same time, the first or last bit of the n-bit data and the discrimination bit are both true, no changing point is generated at the boundary between the first or last bit of the n-bit data and the discrimination bit. This is because the first or last bit of the n-bit data is kept true even if the conversion by the code converter is performed. As a result, the changing point count of the (n+1)-bit serial code can be kept at M [or M'] at most.

In other words, when the bit number n [or (n+1)] of the detection target in the changing-point counter is odd, and the discrimination bit is added as the first bit of the (n+1)-bit serial code, and the first bit of the n-bit data is not a conversion target bit of the code converter, it is preferred that the discrimination bit is true, if the counting result of the changing point counter is equal to M [or M'] and the first bit of the n-bit data is true. When the bit number n [or (n+1)] of the detection target in the changing-point counter is odd, and the discrimination bit is added as the last bit of the (n+1)-bit serial code, and the last bit of the n-bit data is not a conversion target bit of the coder converter, it is preferred that the discrimination bit is true, if the counting result of the changing point counter is equal to M [or M'] and the last bit of the n-bit data is true.

With the encoder according to the first aspect of the invention, as explained above in detail, the changing-point counter and the code converter are provided in addition to the parallel-to-serial converter. The changing-point counter outputs the discrimination bit which is true when the counting result exceeds the predetermined value. The code converter converts the n-bit data in such a way that bits of the n-bit data located at the predetermined positions are inverted when the discrimination bit is true. Therefore, the changing point count of the converted n-bit data is suppressed to M at most. As a result, the changing point count of the (n+1)-bit serial code is reduced to suppress its high-frequency components occurring in the serial transmission operation, thereby effectively suppressing EMI.

Moreover, in a preferred embodiment of the encoder of the first aspect, the (n+1)-bit data generated by adding a last bit of an immediately preceding n-bit serial code the encoder has dealt to the top of the n-bit serial data is used as the detection target of the changing-point counter. The n-bit data is converted by the code converter in such a way that bits of the n-bit data located at predetermined positions are inverted when the discrimination bit is true (i.e., the counting result exceeds the predetermined value M'), where the value M' is a largest integer equal to or less than (n/2) Therefore, the changing point count of the (n+1)-bit serial code per substantial transfer unit is suppressed to (M'+1) at most. This means that not only the changing points of the data to be transferred but also the changing points generated at the boundary between adjoining data to be transferred are reduced, which ensures the suppression of EMI over the whole data to be transmitted.

In another preferred embodiment of the encoder of the first aspect, when the bit number of the detection target date is odd, and the first or last bit of the n-bit data is not a conversion target bit of the code converter, the counting result of the counter is set to be equal to M [or M'] and at the same time, the first or last bit of the n-bit data and the discrimination bit are set to be true. In this embodiment, no changing point is generated at the boundary between the first or last bit of the n-bit data and the discrimination bit. Thus, the changing point count of the (n+1)-bit serial code can be kept at M [or M'] at most, which means that the changing point count of the whole data including the discrimination bit is reduced. As a result, the suppression of EMI is ensured.

In addition, additional data is the discrimination bit (which is preferably one bit). Thus, unlike the second prior-art system, there is no possibility that a changing point or points is/are generated in the additional data itself, and that the bit length is increased due to the complicated additional data and the transmission frequency is raised, preventing the suppression of EMI.

Concretely speaking about the circuit configuration, for example, the changing point counter may be formed by (n−1) two-input exclusive OR gates for detecting the changing points and an adder circuit for counting the changing points thus detected. The code converter may be formed by approximately (n/2) NOT gates for bit inversion and approximately (n/2) switches for switching between the conversion and non-conversion of the bits. Therefore, the encoder according to the first aspect of the invention can be realized with much less circuit components or elements than those of the first prior-art system using the look-up tables. This means that the fabrication cost of the encoder can be lowered.

According to a second aspect of the present invention, another encoder is provided. This encoder comprises:

a parallel-to-serial converter for converting n-bit data (n: a positive integer) to n-bit serial data;

a changing-point counter for counting changing points of the n-bit serial data to generate a counting result, where values of adjoining bits change at each of the changing points;

the changing-point counter outputting a discrimination bit which is true when the counting result exceeds a predetermined value;

a code converter for converting the n-bit serial data to a (n+1)-bit serial code in such a way that bits of the n-bit serial data located at predetermined positions are inverted when the discrimination bit is true; and the (n+1)-bit serial code being generated by adding the discrimination bit to the n-bit serial data.

With the above-described encoder according to the first aspect of the invention, the changing-point counter counts the changing points of n-bit parallel data to generate the counting result and outputs the discrimination bit which is true when the counting result exceeds the predetermined value. After the conversion is performed or is not performed by the code converter, the (n+1)-bit data is converted to the (n+1)-bit serial code by the parallel-to-serial converter. Unlike this, with the encoder according to the second aspect of the invention, the changing-point counter counts the changing points of the n-bit serial data generated by the parallel-to-serial converter from the n-bit data, and outputs the discrimination bit. After the conversion is performed or is not performed by the code converter, the (n+1)-bit serial code is generated by adding the discrimination bit to the n-bit serial data.

With the encoder of the second aspect, like the encoder of the first aspect, the changing-point counter outputs the discrimination bit which is true when the counting result exceeds the predetermined value. The code converter converts the n-bit data in such a way that the bits of the n-bit data located at the predetermined positions are inverted when the discrimination bit is true. Therefore, the changing point count of the converted n-bit data is suppressed to M at most. As a result, the changing point count of the (n+1)-bit serial code is reduced to suppress its high-frequency components occurring in the serial transmission operation, thereby effectively suppressing EMI.

Moreover, in a preferred embodiment of the encoder of the second aspect, the (n+1)-bit data generated by adding a last bit of an immediately preceding n-bit serial code the encoder has dealt to the top of the n-bit serial data is used as the detection target of the changing-point counter. The n-bit data is converted by the code converter in such a way that bits of the n-bit data located at predetermined positions are inverted when the discrimination bit is true (i.e., the counting result exceeds the predetermined value M'), where the value M' is a largest integer equal to or less than (n/2) Therefore, the changing point count of the (n+1)-bit serial code per substantial transfer unit is suppressed to (M'+1) at most. This means that not only the changing points of the data to be transferred but also the changing points generated at the boundary between adjoining data to be transferred are reduced, which ensures the suppression of EMI over the whole data to be transmitted.

In another preferred embodiment of the encoder of the second aspect, when the bit number of the detection target date is odd, and the first or last bit of the n-bit data is not a conversion target bit of the coder converter, the counting result of the counter is set to be equal to M [or M'] and at the same time, the first or last bit of the n-bit data and the discrimination bit are set to be true. In this embodiment, no changing point is generated at the boundary between the first or last bit of the n-bit data and the discrimination bit. Thus, the changing point count of the (n+1)-bit serial code can be kept at M [or M'] at most, which means that the changing point count of the whole data including the discrimination bit is reduced. As a result, the suppression of EMI is ensured.

Concretely speaking about the circuit configuration, unlike the encoder of the first aspect, the n-bit serial data is processed. Therefore, the process by the changing point counter and the process by the code converter need to be carried out in two temporally different stages. Bit-based timing control needs to be made in each of these two stages.

For example, excluding the circuit for timing control, the changing point counter may be formed by flip-flops for holding the adjoining bits, two-input exclusive OR gates for detecting the changing points, and a counter for counting the changing points thus detected. The code converter may be formed by a shift register for successively outputting the n-bit serial data, a flip-flop for holding the discrimination bit, NOT gates for bit inversion, and switches for switching between the conversion and non-conversion of the bits, and gates for adding the discrimination bit to the n-bit data.

With encoder according to the second aspect of the invention, the quantity of the circuit components or elements is increased compared with the encoder according to the first aspect. However, the encoder of the second aspect can be realized with much less circuit components or elements than those of the first prior-art system using the look-up tables. This means that the fabrication cost of the encoder can be lowered.

According to a third aspect of the invention, a decoder is provided, which comprises:

a serial-to-parallel converter for converting the (n+1)-bit serial code generated by the encoder according to the first or second aspect of the invention to a (n+1)-bit parallel data; and a code deconverter for deconverting the (n+1)-bit parallel data in such a way that some of the n-bits of the (n+1)-bit parallel data located at predetermined positions excluding the discrimination bit are inverted when the discrimination bit is true.

With the decoder according to the third aspect of the invention, the bit positions at which the bits are deconverted by the code deconverter needs to be equal to the bit position at which the bits are converted by the code converter in the encoder according to the first or second aspect of the invention. Thus, the (n+1)-bit parallel data transferred by the encoder according to the first or second aspect can be decoded to the original n-bit parallel data.

Concretely speaking about the circuit configuration, for example, the code deconverter may be formed by approximately (n/2) NOT gates for bit inversion, and approximately (n/2) switches for switching between the inversion and non-inversion of the bits. Therefore, the decoder according to the third aspect of the invention can be realized with much less circuit components or elements than those of the first prior-art system using the look-up tables. This means that the fabrication cost of the decoder can be lowered.

According to a fourth aspect of the invention, another decoder is provided, which comprises:

a code deconverter for deconverting the (n+1)-bit serial code generated by the encoder according to the first or second aspect of the invention in such a way that some of the n-bits of the (n+1)-bit serial code located at predetermined positions excluding the discrimination bit are inverted when the discrimination bit is true, thereby outputting a n-bit serial data; and a serial-to-parallel converter for converting the n-bit serial data to a n-bit parallel data.

With the decoder according to the fourth aspect of the invention, the bit positions at which the bits are inverted by the code deconverter need to be equal to the bit positions at which the bits are converted by the code converter in the encoder according to the first or second aspect of the invention. Thus, the (n+1)-bit serial code transferred by the encoder according to the first or second aspect can be decoded to the original n-bit parallel data.

Concretely speaking about the circuit configuration, unlike the decoder according to the third aspect, the (n+1)-bit serial code is processed. Therefore, excluding the circuit for timing control, for example, the code deconverter may be formed by gates for separating the n-bits and the discrimination bit from the (n+1)-bit serial code, a shift register for successively outputting the n-bit serial data, a flip-flop for holding the discrimination bit, and switches for switching between the inversion and non-inversion of the bits.

Although the circuit components or elements are somewhat increased compared with the decoder of the third aspect, the decoder according to the fourth aspect of the invention can be realized with much less circuit components or elements than those of the first prior-art system using the look-up tables. This means that the fabrication cost of the decoder can be lowered.

According to a fifth aspect of the invention, a data transfer system is provided, which comprises:
(a) the encoder according to the first or second aspect of the invention located in a data transmission side; and
(b) the decoder according to the third or fourth aspect of the invention located in a data reception side;
wherein the (n+1)-bit serial code is serially transferred from the data transmission side to the date reception side.

With data transfer system according to the fifth aspect of the invention, when the encoder according to the first aspect of the invention is located in the data transmission side, any one of the decoders according to the third and fourth aspects of the invention may be located in the data reception side. Similarly, when the encoder according to the second aspect of the invention is located in the data transmission side, any one of the decoders according to the third and fourth aspects of the invention may be located in the data reception side.

With data transfer system according to the fifth aspect of the invention, the (n+1)-bit serial code having decreased changing points is outputted by the encoder located in the data transmission side, and the (n+1)-bit serial code is decoded by the decoder located in the data reception side. Therefore, the changing point count of the (n+1)-bit serial code is reduced to suppress its high-frequency components occurring in the serial transmission operation, thereby effectively suppressing EMI.

In addition, the encoder of the first or second aspect and the decoder of the third or fourth aspect can be realized with much less circuit components or elements than those of the first prior-art system using the look-up tables. This means that the fabrication cost of the system can be lowered.

According to a sixth aspect of the invention, another data transfer system is provided, which comprises:
(a) a changing-point counter and a code converter located in a data transmission side;
the changing-point counter counting changing points of n-bit data (n: a positive integer) to generate a counting result, where values of adjoining bits change at each of the changing points;
the changing-point counter outputting a discrimination bit which is true when the counting result exceeds a predetermined value;
the code converter converting the n-bit data in such a way that bits of the n-bit data located at predetermined positions are inverted when the discrimination bit is true, thereby generating an inverted n-bit data; and
the code converter outputting a (n+1)-bit serial code generated by adding the discrimination bit to the inverted n-bit data;
(b) a code deconverter located in a data reception side;
the code deconverter deconverting the (n+1)-bit serial code outputted from the code converter in such a way that some of the n-bits of the (n+1)-bit serial code located at predetermined positions excluding the discrimination bit are inverted when the discrimination bit is true;
wherein the (n+1)-bit serial code is serially transferred from the data transmission side to the date reception side.

The data transfer system according to the sixth aspect of the invention comprises the changing point counter and the code converter used in the encoder according to the second aspect, and the code deconverter used in the decoder according to the fourth aspect.

With the system of the sixth aspect, like the encoder of the second aspect, the changing-point counter outputs the discrimination bit which is true when the counting result exceeds the predetermined value. The code converter converts the n-bit data in such a way that bits of the n-bit data located at the predetermined positions are inverted when the discrimination bit is true. Therefore, the changing point count of the converted n-bit data is suppressed to M at most. As a result, the changing point count of the (n+1)-bit serial code is reduced to suppress its high-frequency components occurring in the serial transmission operation, thereby effectively suppressing EMI.

Moreover, in a preferred embodiment of the system of the sixth aspect, in the encoder, the (n+1)-bit data generated by adding a last bit of an immediately preceding n-bit serial code the encoder has dealt to the top of the n-bit serial data is used as the detection target of the changing-point counter. The n-bit data is converted by the code converter in such a way that bits of the n-bit data located at predetermined positions are inverted when the discrimination bit is true (i.e., the counting result exceeds the predetermined value M'), where the value M' is a largest integer equal to or less than (n/2). Therefore, the changing point count of the (n+1)-bit serial code per substantial transfer unit is suppressed to (M'+1) at most. This means that not only the changing points of the data to be transferred but also the changing points generated at the boundary between adjoining data to be transferred are reduced, which ensures the suppression of EMI over the whole data to be transmitted.

In another preferred embodiment of the system of the sixth aspect, in the encoder, when the bit number of the detection target date is odd, and the first or last bit of the n-bit data is not a conversion target bit of the coder converter, the counting result of the counter is set to be equal to M [or M'] and at the same time, the first or last bit of the n-bit data and the discrimination bit are set to be true. In this embodiment, no changing point is generated at the boundary between the first or last bit of the n-bit data and the discrimination bit. Thus, the changing point count of the (n+1)-bit serial code can be kept at M [or M'] at most, which means that the changing point count of the whole data including the discrimination bit is reduced. As a result, the suppression of EMI is ensured.

As described above, with data transfer system according to the sixth aspect of the invention, the (n+1)-bit serial code having decreased changing points is outputted by the encoder located in the data transmission side, and the (n+1)-bit serial code is decoded by the decoder located in the data reception side. Therefore, the changing point count of the (n+1)-bit serial code is reduced to suppress its high-frequency components occurring in the serial transmission operation, thereby effectively suppressing EMI.

Concretely speaking about the circuit configuration, the system of the sixth aspect may be formed using the same configuration as the encoder of the second aspect and the same configuration as the decoder of the fourth aspect. Thus, the system of the sixth aspect can be realized with much less circuit components or elements than those of the first prior-art system using the look-up tables. This means that the fabrication cost of the system can be lowered.

BRIEF DESCRIPTION OF THE DRAWINGS

In order that the present invention may be readily carried into effect, it will now be described with reference to the accompanying drawings.

FIGS. 12A and 12B are conceptual diagrams explaining a concrete example of a 9-bit serial code generated by an encoder according to the fourth embodiment of the invention, respectively.

FIG. 17 is a functional block diagram showing the circuit configuration of a data transfer system according to a seventh embodiment of the invention.

DETAILED DESCRIPTION OF THE PREFERRED EMBODIMENTS

Figure 1:
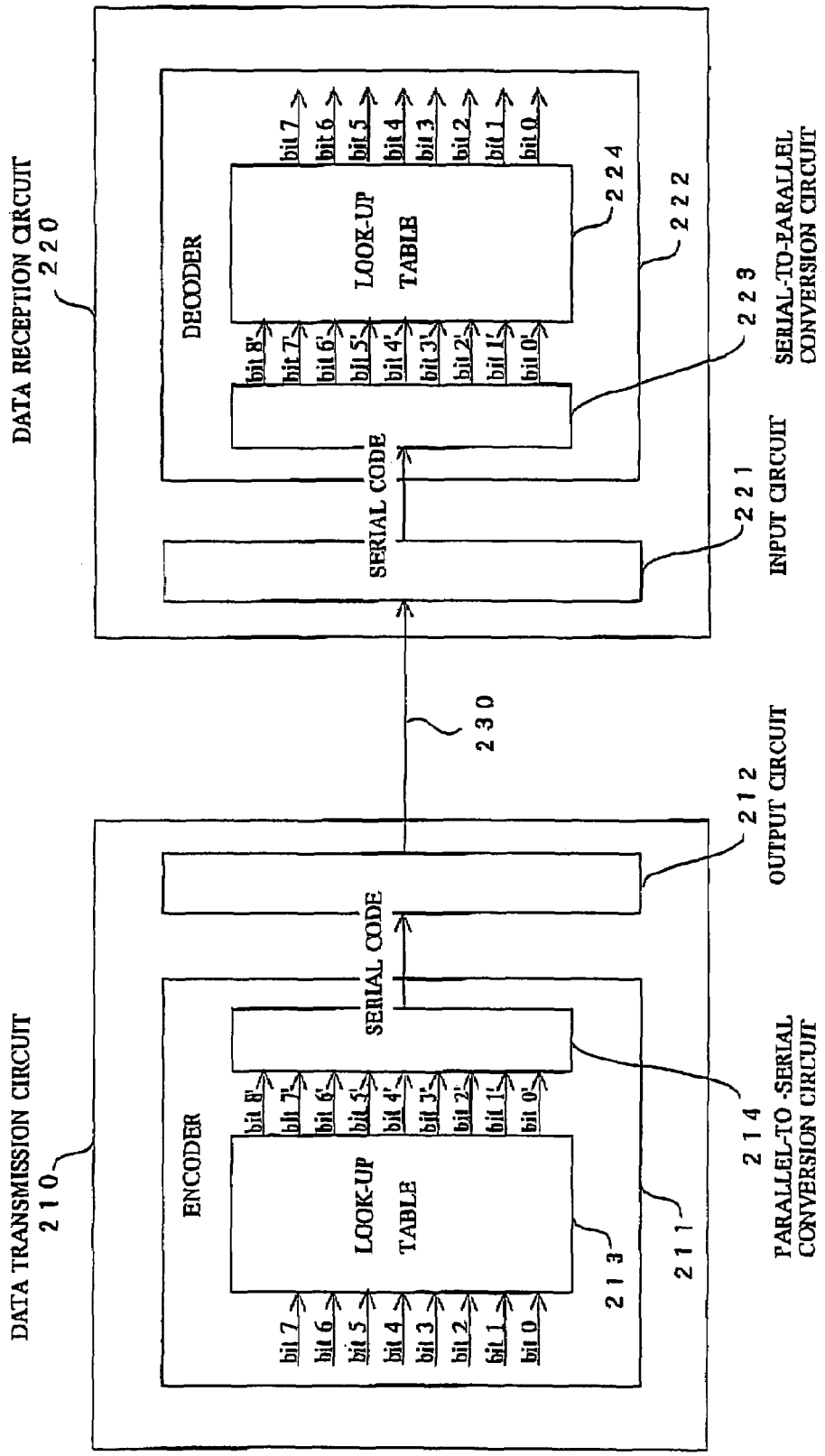
FIG. 1 is a functional block diagram showing the circuit configuration of a prior-art data transfer system.

Preferred embodiments of the present invention will be described in detail below while referring to the drawings attached.

In the following explanation, the positive logic representation is used, specifically, a logic true value is expressed as "1" while a logic false value is "0". However, needless to say, the negative logic representation may be used.

First Embodiment

Figure 2:
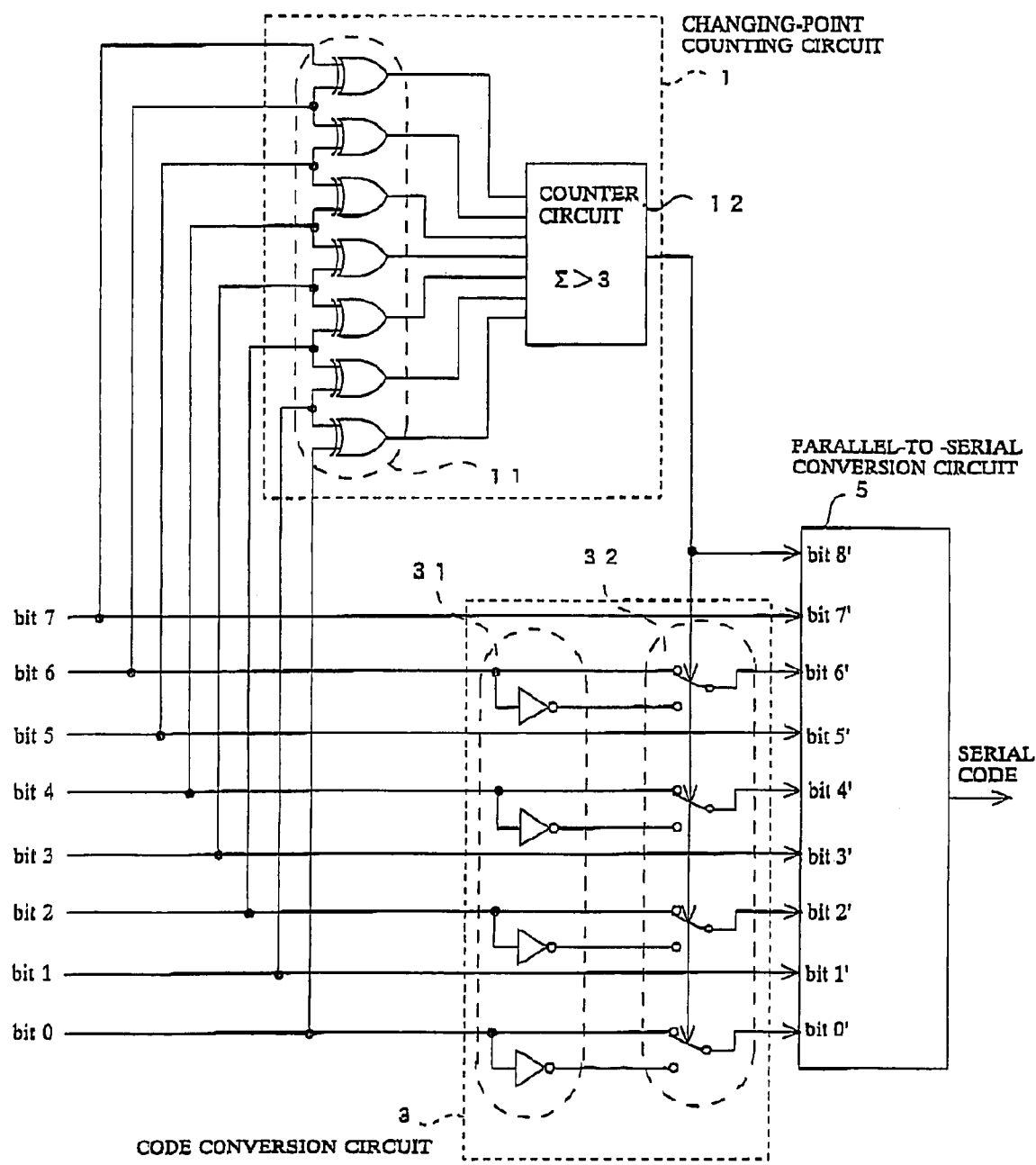
FIG. 2 is a functional block diagram showing the circuit configuration of an encoder according to a first embodiment of the invention.

FIG. 2 is a functional block diagram showing the circuit configuration of an encoder according to a first embodiment of the invention, where 8-bit parallel data having a changing point count of 0 to 7 is inputted and a 9-bit serial code having a changing point count of 0 to 4 is outputted, where n=8. The 9-bit serial code, which includes a discrimination bit, is subjected to suppression of EMI. The discrimination bit is added to show the fact that code conversion was applied to the 8-bit parallel data or not.

The encoder according to the first embodiment of FIG. 2 comprises a changing-point counting circuit 1, a code conversion circuit 3, and a parallel-to-serial conversion circuit 5.

The changing-point counting circuit 1 counts the changing points of the 8-bit data (bit0 to bit7) to generate a counting result, where values of the adjoining bits change at each of the changing points. The circuit 1 outputs the discrimination bit (bit8'), which is true when the counting result exceeds a predetermined value of 3.

The code conversion circuit 3 converts the 8-bit data (bit0 to bit7) in such a way that the bits (i.e., bit0, bit2, bit4, and bit6) of the data (bit0 to bit7) located at its even-numbered positions are inverted when the discrimination bit (bit8') is true.

The parallel-to-serial conversion circuit 5 converts 9-bit data (bit0' to bit8') to a 9-bit serial code. The 9-bit data (bit0' to bit8') is generated by adding the discrimination bit (bit8') to the output of the code conversion circuit 3, i.e., the 8-bit data (bit0' to bit7'), as its MSB.

The changing-point counting circuit 1 includes a changing-point detection circuit 11 having seven two-input exclusive OR (EXOR) gates, and a counter circuit 12.

In the changing-point detection circuit 1, the two adjoining bits (i.e., bit0 and bit1, bit1 and bit2, bit2 and bit3, bit3 and bit4, bit4 and bit5, bit5 and bit6, and bit6 and bit7) of the 8-bit data are inputted into the seven two-input exclusive OR (EXOR) gates, respectively, thereby detecting whether the two adjoining bits have different values or not. Since each of the EXOR gates outputs a true value "1" when the two adjoining bits have different values, the changing points of the 8-bit data (bit0 to bit7) can be detected.

The counter circuit 12 receives the outputs of the seven EXOR gates and then, counts the changing points of the data (bit0 to bit7) to output a counting result. The counter circuit 12 outputs the discrimination bit (bit8') according to the counting result. If the counting result has a value exceeding the predetermined value of 3, the discrimination bit (bit8') has a true value "1". If the counting result has a value not exceeding the predetermined value of 3, the discrimination bit (bit8') has a false value "0". This operation can be easily realized if, for example, an adder circuit (not shown) is provided for counting the true values of the outputs of the seven EXOR gates, and the third-digit output of the adder circuit is assigned to the discrimination bit (bit8').

The code conversion circuit 3 comprises an inverter circuit 31 having four NOT gates and a switching circuit 32 having four two-input switches. The inverter circuit 31 inverts the four bits (i.e., bit0, bit2, bit4, and bit6) of the 8-bit data (bit0 to bit7) located at its even-numbered positions with the four NOT gates.

The switching circuit 32 conducts its switching operation in such a way that (i) the even-numbered bits (i.e., bit0, bit2, bit4, and bit6) do not pass through the corresponding NOT gates when the discrimination bit (bit8') has a false value "0", and (ii) the even-numbered bits (i.e., bit0, bit2, bit4, and bit6) pass through the corresponding NOT gates when the discrimination bit (bit8') has a true value "1". Therefore, when the discrimination bit (bit8') has a false value "0" (i.e., the value of the counting result of the changing points do not exceed 3), all the 8-bit data (bit0 to bit7) are applied to the parallel-to-serial conversion circuit 5 without change or inversion. On the other hand, when the discrimination bit (bit8') has a true value "1" (i.e., the value of the counting result of the changing points exceeds 3), the 8-bit data (bit0 to bit7) are applied to the parallel-to-serial conversion circuit 5 without change or inversion. On the other hand, the even-numbered bits (i.e., bit0, bit2, bit4, and bit6) are applied to the parallel-to-serial conversion circuit 5 after inversion and the odd-numbered bits (i.e., bit1, bit3, bit5, and bit7) are applied to the circuit 5 without inversion.

Here, the bit position of the 8-bit data (bit0 to bit7) is counted from 0 to 7. Thus, the first-digit bit is bit0. However, the invention is not limited to this. Any other counting method may be used for this purpose.

The parallel-to-serial conversion circuit 5 receives the 9-bit parallel data (bit0' to bit8') generated by adding the discrimination bit (bit8') (which is the output of the changing-point counting circuit 1) to the 8-bit output data (i.e., bit0' to bit7') of the code conversion circuit 3 as its MSB. The circuit 5 converts the 9-bit parallel data (bit0' to bit8') to a 9-bit serial code and outputs the same.

Next, the operation principle (e.g., the condition for generating the discrimination bit (bit8'), and the arrangement of the 9-bit serial code) of the encoder according to the first embodiment is explained below. In addition, the reducing effect of the changing points in the 9-bit serial code will be referred based on statistical analysis.

From the above-described Property 2, when the count of the changing points of the 8-bit data (bit0 to bit7) is defined as Np, and the count of the inverted 8-bit data generated by alternately inverting the constituent bits of the data (bit0 to bit7) is defined as Nq is given by the following equation.

$$Nq=(8-1)-Np=7-Np.$$

Therefore, Nq of the inverted 8-bit data is given by Nq=7−Np. Thus, if the 8-bit data (bit0 to bit7) having seven changing points is alternately inverted, Nq of the inverted 8-bit data is 0. Similarly, if the 8-bit data (bit0 to bit7) having six changing points is alternately inverted, Nq of the inverted 8-bit data is 1. If the 8-bit data (bit0 to bit7) having five changing points is alternately inverted, Nq of the inverted 8-bit data is 2. If the 8-bit data (bit0 to bit7) having four changing points is alternately inverted, Nq of the inverted 8-bit data is 3. If the 8-bit data (bit0 to bit7) having three changing points is alternately inverted, Nq of the inverted 8-bit data is 4. If the 8-bit data (bit0 to bit7) having two changing points is alternately inverted, Nq of the inverted 8-bit data is 5. If the 8-bit data (bit0 to bit7) having one changing point is alternately inverted, Nq of the inverted 8-bit data is 6. If the 8-bit data (bit0 to bit7) having no changing point is alternately inverted, Nq of the inverted 8-bit data is 7.

In the encoder of the first embodiment, it is preferred that the predetermined positions of the 8-bit data (bit0 to bit7) at which the corresponding bits are inverted are odd- or even-numbered bits. Moreover, it is preferred that the predetermined value M for the changing-point counting circuit is set at a largest integer equal to or less than $(\frac{1}{2}) \times (n-1)$. Here, n=8 and therefore, $(\frac{1}{2}) \times (n-1)=3.5$. Thus, the value M is set at 3, which is a largest integer equal to or less than 3.5. In the code conversion circuit 3, as described above, the even-numbered bits (i.e., bit0, bit2, bit4, and bit6) of the 8-bit data are inverted while the odd-numbered bits (i.e., bit1, bit3, bits, and bit7) thereof are not inverted.

Specifically, when the count of the changing points of the 8-bit data (bit0 to bit7) is in the range of 0 to 3, the code conversion circuit 3 does not conduct its conversion operation. In this case, the count of the changing points of the 8-bit data is kept unchanged. On the other hand, when the count of the changing points of the 8-bit data (bit0 to bit7) is in the range of 4 to 7, the code conversion circuit 3 conducts its conversion operation. Thus, the count of the changing points of the 8-bit data is reduced to the range of 0 to 3. Therefore, in this case, the count of the changing points of the 8-bit data is reduced to M at most.

Figure 3A:
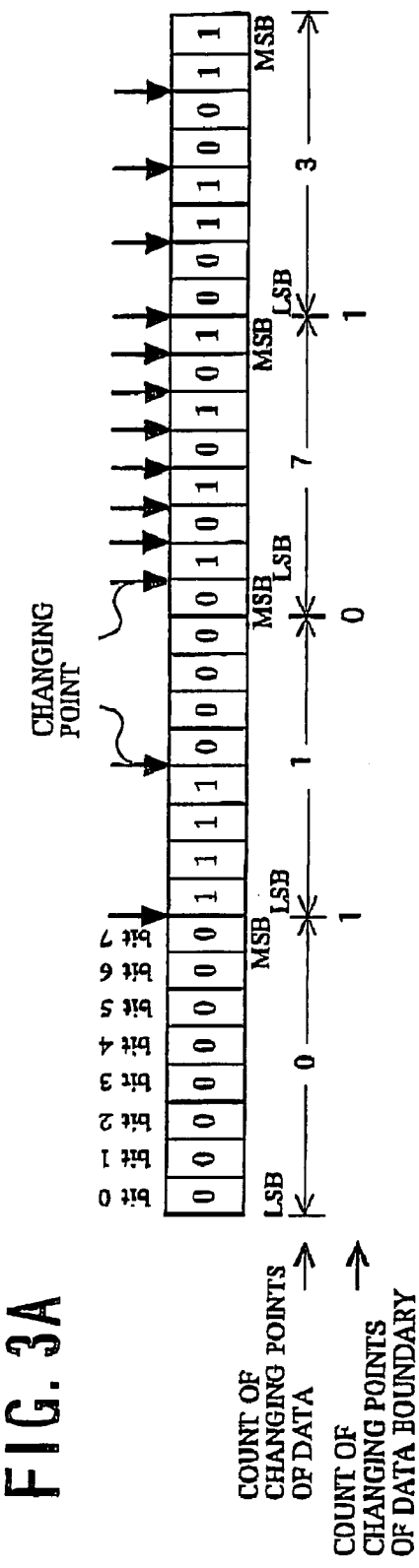
FIGS. 3A and 3B are conceptual diagrams explaining a concrete example of a 9-bit serial code generated by an encoder according to a first embodiment of the invention, respectively.
Figure 3B:
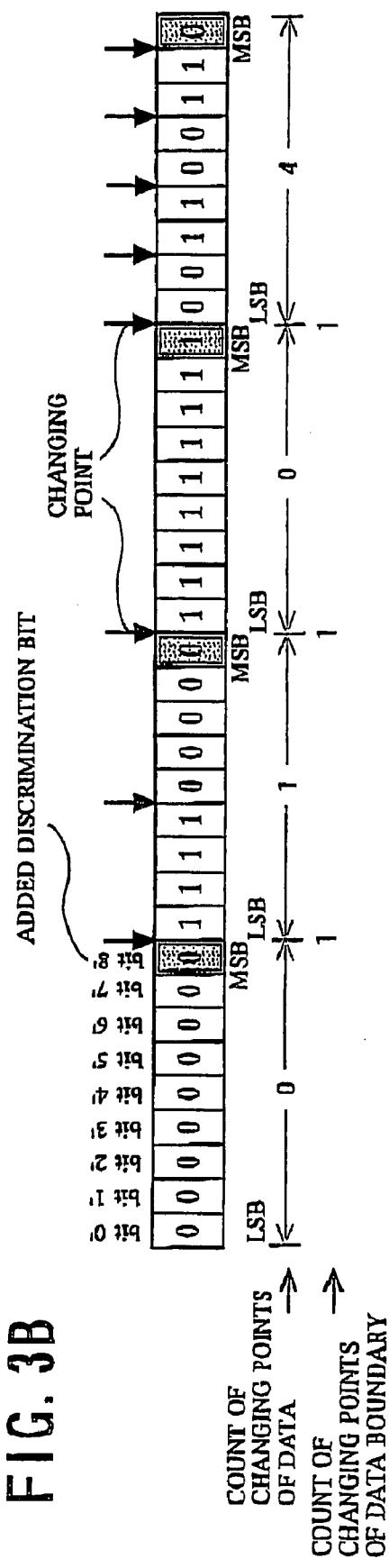

A concrete example of the 9-bit serial code generated by the encoder of the first embodiment is shown in FIGS. 3A and 3B. In the following explanation, the word "transfer" is used, because the 9-bit serial code generated by the encoder of the first embodiment will be usually used for a data transfer system as its transmission-side subsystem.

FIG. 3A shows four units of a 8-bit serial code (bit0 to bit7) generated by simple parallel-to-serial conversion, where the transfer unit is 8 bits. FIG. 3B shows four units of the 9-bit serial code (bit0' to bit8') generated by the encoder of the first embodiment, where the transfer unit is 9 bits. Both of these codes are generated from the same input data (i.e., bit0 to bit7), and successively outputted from the right ends (i.e., the LSB side) of FIGS. 3A and 3B. The downward arrows, which are located above the data bit series, denote the changing points (i.e., at which the values of the adjoining bits are different).

Comparing the counts of the changing points of these two data, 0, 1, 7, and 3 are seen from the first to fourth transfer units in FIG. 3A. Two changing points are additionally generated at the boundaries of the first to fourth transfer units. As a result, the count of the changing points of the 8-bit data in FIG. 3A is 13 in total. On the other hand, 0, 1, 0, and 4 are seen from the first to fourth transfer units in FIG. 3B. Three changing points are additionally generated at the boundaries of the first to fourth transfer units. As a result, the count of the changing points of the 9-bit data in FIG. 3B is 8 in total. Thus, in the encoder of the first embodiment of the invention, the count of the changing points is decreased from 13 to 8.

The count of the changing points of the 9-bit serial code (bit0 to bit8') is reduced to 4 at most, which is not equal to M but (M+1). This is because the discrimination bit (bit8') is added to the 8-bit data (bit0' to bit7') outputted from the code conversion circuit 3 as its MSB. A changing point may be additionally generated at the boundary between the discrimination bit (bit8') and the data bit (bit7').

Figure 4A:
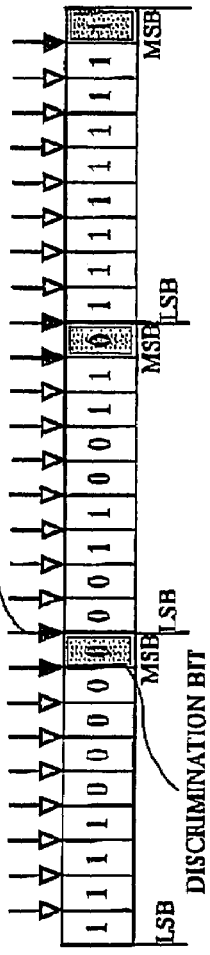
FIGS. 4A and 4B are conceptual diagrams explaining the "controllable changing points" and the "uncontrollable changing points", where a serial code including the discrimination bit at its MSB is shown in FIG. 4A and a serial code including the discrimination bit at a position other than its MSB and LSB is shown in FIG. 4B.
Figure 4B:
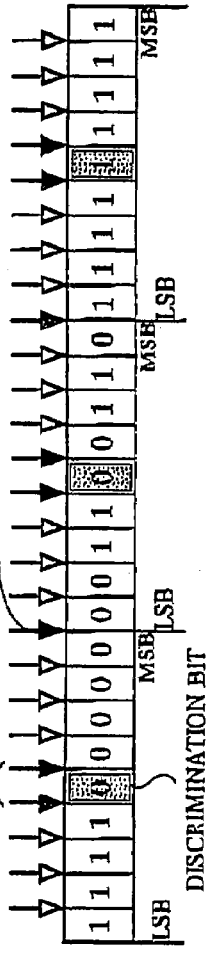

With the encoder of the first embodiment of the invention, as explained above, the discrimination bit (bit8') is added to the 8-bit data (bit0' to bit7') outputted from the code conversion circuit 3 as its MSB. The validity of this layout is explained below with reference to FIGS. 4A and 4B. In FIG. 4A, the 9-bit serial code (bit0' to bit8') generated by the encoder of the first embodiment is shown, where the discrimination bit (bit8') is added to the 8-bit data (bit0' to bit7') as its MSB. In FIG. 4B, the 9-bit serial code (bit0' to bit8') generated by the encoder of the first embodiment is also shown, where the discrimination bit (bit8') is added to the 8-bit data (bit0' to bit7') at a position other than MSB and LSB.

In the encoder of the first embodiment, the changing points of the 8-bit data (bit0 to bit7) is detected by the changing point detection circuit 11 of the changing-point counting circuit 1. With regard to the 8-bit data (bit0' to bit7') excluding the discrimination bit (bit8'), the possibility that a changing point is formed at a bit boundary after the conversion operation of the code conversion circuit 3 is reduced to 50% or lower. Thus, a changing point formed at a bit boundary is termed a "controllable changing point" below, which is shown by a void arrow in FIGS. 4A and 4B.

On the other hand, the changing points at the boundaries of the adjoining transfer units are not detected by the changing point detection circuit 11 of the changing-point counting circuit 1. This means that the existence and absence of the changing points at the boundaries of the adjoining transfer units do not affect the value of the discrimination bit (i.e., the conversion or non-conversion by the code conversion circuit 3). In addition, the adjoining data bits between the adjoining transfer units are independent of each other. Therefore, the possibility that a changing point is formed at a transfer unit boundary is 50%. Thus, a changing point formed at a transfer unit boundary is termed a "uncontrollable changing point" below, which is shown by a solid arrow in FIGS. 4A and 4B.

Furthermore, the bit boundaries at the front and rear ends of the discrimination bit are not detected by the changing point detection circuit 11 of the changing-point counting circuit 1. The discrimination bit and its adjoining bits are independent of each other. Therefore, the possibility that a changing point is formed at the bit boundary at the front or rear end of the discrimination bit is 50%. Thus, a changing point formed at the bit boundary at the front or rear end of the discrimination bit is also termed a "uncontrollable changing point".

Accordingly, as shown in FIG. 4B, the 9-bit serial code for one transfer unit includes three uncontrollable changing points generated at the transfer unit boundary and the two bit boundaries at the front and rear ends of the discrimination bit. If the count of the uncontrollable changing points is too many, the overall possibility of the changing points for one transfer unit approaches 50%, resulting in decrease of the reduction rate or effect of the changing points.

To avoid this disadvantage, in the encoder of the first embodiment, the discrimination bit is located at the MSB of the 9-bit serial code in such a way that the boundary of the transfer data overlaps with the bit boundary at the rear end of the discrimination bit, as shown in FIG. 4A. Thus, two of the uncontrollable changing points are eliminated for the transfer unit. As easily seen from this, the discrimination bit may be located at the LSB of the 9-bit serial code in such a way that the boundary of the transfer data overlaps with the bit boundary at the front end of the discrimination bit. In this case, two of the uncontrollable changing points can be eliminated for the transfer unit.

In summary, with the encoder of the first embodiment, the predetermined value M for the changing-point counting circuit 1 is set at 3, and the even-numbered bits (i.e., bit0, bit2, bit4, and bit6) of the 8-bit data (bit0 to bit7) are inverted while the odd-numbered bits (i.e., bit1, bit3, bit5, and bit7) thereof are not inverted. Therefore, the count of the changing points of the 8-bit data (bit0' to bit7') outputted from the code conversion circuit 3 is reduced to M=3 at most.

Moreover, because the discrimination bit (bit8') is added to the 8-bit data (bit0' to bit7') outputted from the circuit 3 as its MSB, the count of the changing points of the 9-bit serial code (bit0' to bit8') is reduced to (M+1)=4 at most, and the count of the changing points of the 9-bit serial code for the transfer unit is reduced to (M+2)=5 at most.

Subsequently, the reducing effect of the changing points in the 9-bit serial code in the encoder of the first embodiment will be explained based on statistical analysis.

Figure 5:
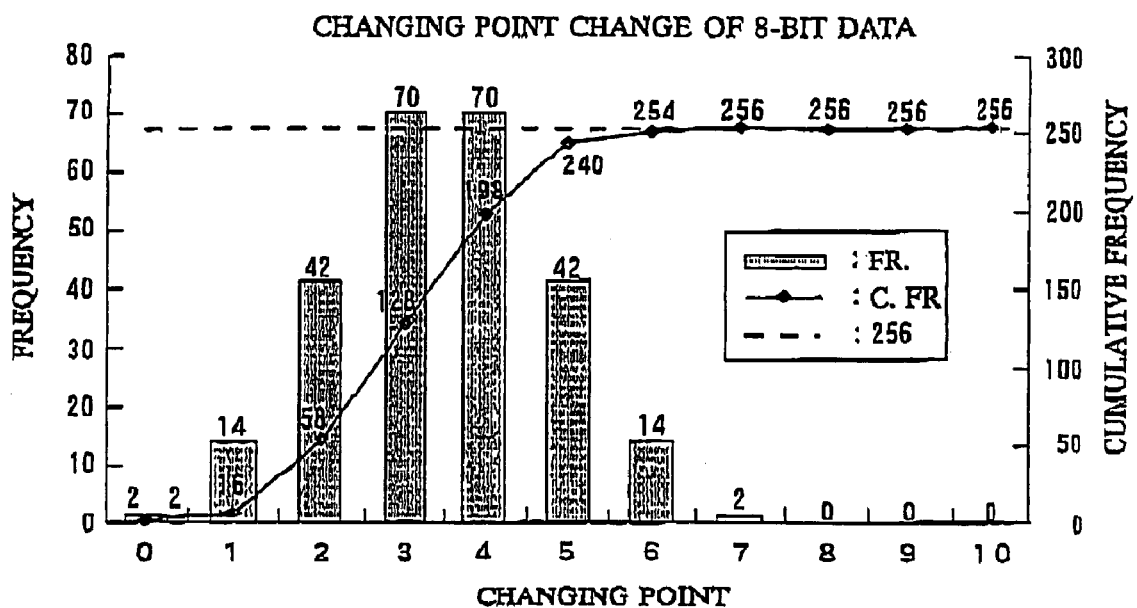
FIG. 5 is a graph showing the frequency and the cumulative frequency of the changing points of an ordinary 8-bit data to which no process is applied.

FIG. 5 is a graph showing the frequency and the cumulative frequency of the changing points of an ordinary 8-bit data to which no process (like the code conversion in the first embodiment) is applied. The frequency of the changing points is shown in the form of bar graph while the cumulative frequency thereof is shown in the form of line graph.

Here, the bit length of the data is defined as n and the changing point count of the n-bit data is defined as m. In this case, because of the previously explained Property 1, the count of the bit boundaries where changing points may be formed is (n−1) and the changing point count m is an integer ranging from 0 to (n−1). Since the changing point may be independently formed at any bit boundary, the changing point count m can be calculated by a binominal coefficient of $_{(n-1)}C_m$.

Moreover, the changing point is generated at a bit boundary between the bits "01" and "10". Accordingly, the frequency that the changing point count m of the n-bit data is generated is given by the following expression.

$2 \times {}_{(n-1)}C_m$.

As seen from FIG. 5, the 8-bit data having a changing point count of 0 is two (i.e., "00000000" and "11111111"), the 8-bit data having a changing point count of 1 is 14 (e.g., "10000001" and "11110000"), the 8-bit data having a changing point count of 3 is 42, and the 8-bit data having a changing point count of 7 is two (i.e., "10101010" and "01010101"). The cumulative frequency is the sum of the frequencies of the changing point from 0 to a specified number. If a 8-bit data is transferred as the transfer unit, the cumulative frequency is 256.

Figure 6:
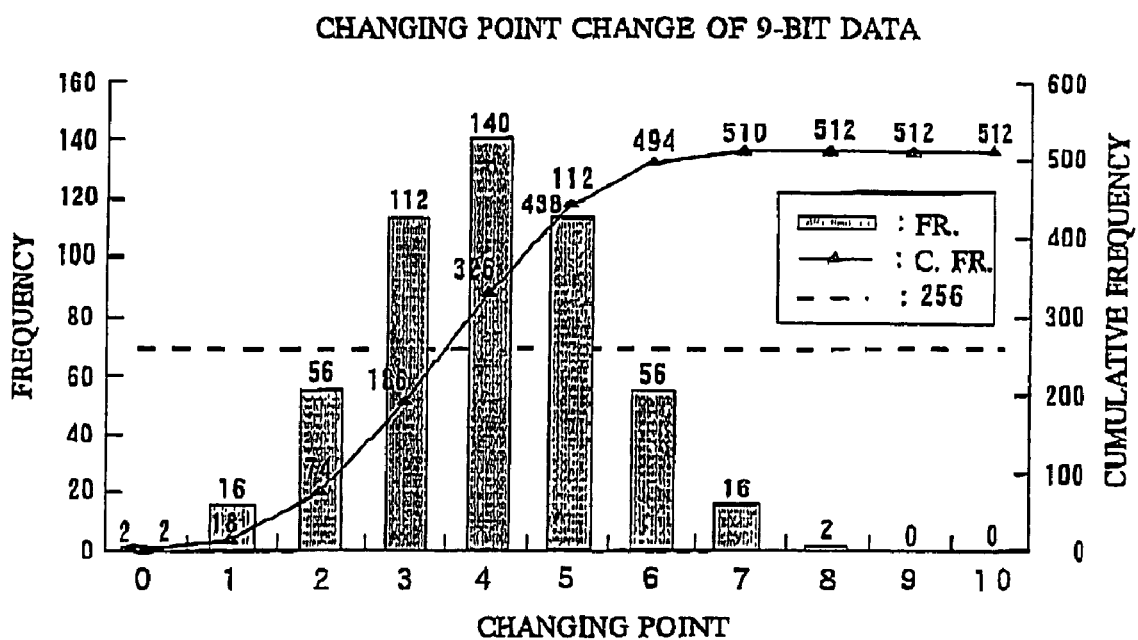
FIG. 6 is a graph showing the frequency and the cumulative frequency of the changing points of an ordinary 9-bit data to which no process is applied.

FIG. 6' is a graph showing the frequency and the cumulative frequency of the changing points of an ordinary 9-bit data to which no process (like the code conversion in the first embodiment) is applied. The frequency of the changing points is shown in the form of bar graph while the cumulative frequency thereof is shown in the form of line graph.

In the encoder of the first embodiment, the 8-bit data is converted to the 9-bit data. FIGS. 5 and 6 show the possibility of reduction of the changing points using the 9-bit data. Specifically, the cumulative frequency for the 8-bit data is 256, and the number of the cumulative frequency is equal to 256 or greater when the changing point count is 4 in FIG. 6. Therefore, it is seen from FIG. 6 that the predetermined number for the changing-point counting circuit 1 should be set at 3 in such a way that the 9-bit data after conversion has a changing point count of 4 at most.

Figure 7:
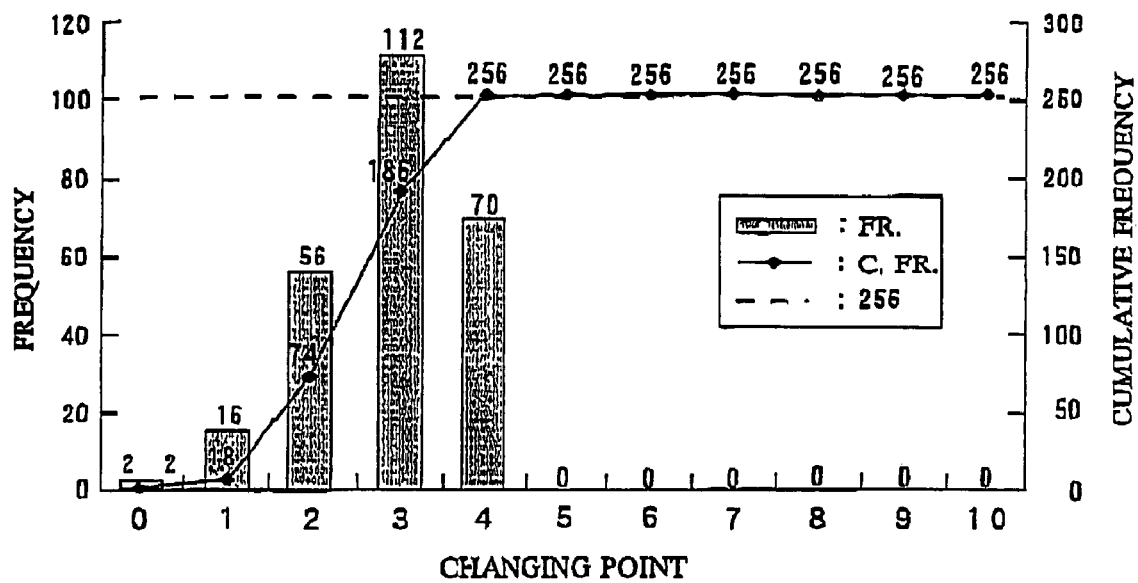
FIG. 7 is a graph showing the frequency and the cumulative frequency of the changing points of a 9-bit data generated by the encoder according to the first embodiment of the invention.

FIG. 7 is a graph showing the frequency and the cumulative frequency of the changing points of the 9-bit data used in the first embodiment. The frequency of the changing points is shown in the form of bar graph while the cumulative frequency thereof is shown in the form of line graph.

With the encoder of the first embodiment, the predetermined value M for the changing-point counting circuit 1 is set at 3, and the even-numbered bits (i.e., bit0, bit2, bit4, and bit6) of the 8-bit data are inverted while the odd-numbered bits (i.e., bit1, bit3, bits, and bit7) thereof are not inverted. Therefore, the count of the changing points of the 8-bit data (bit0' to bit7') outputted from the code conversion circuit 3 is reduced to M=3 at most. Moreover, because the discrimination bit (bit8') is added to the 8-bit data (bit0' to bit7') outputted from the circuit 3 as its MSB, the count of the changing points of the 9-bit serial code (bit0' to bit8') is reduced to (M+1)=4 at most. It is seen from FIGS. 5 and 7 that the 8-bit data having a changing point count from 0to 7 is converted to the 9-bit serial code having a changing point count from 0to 4.

Figure 8:
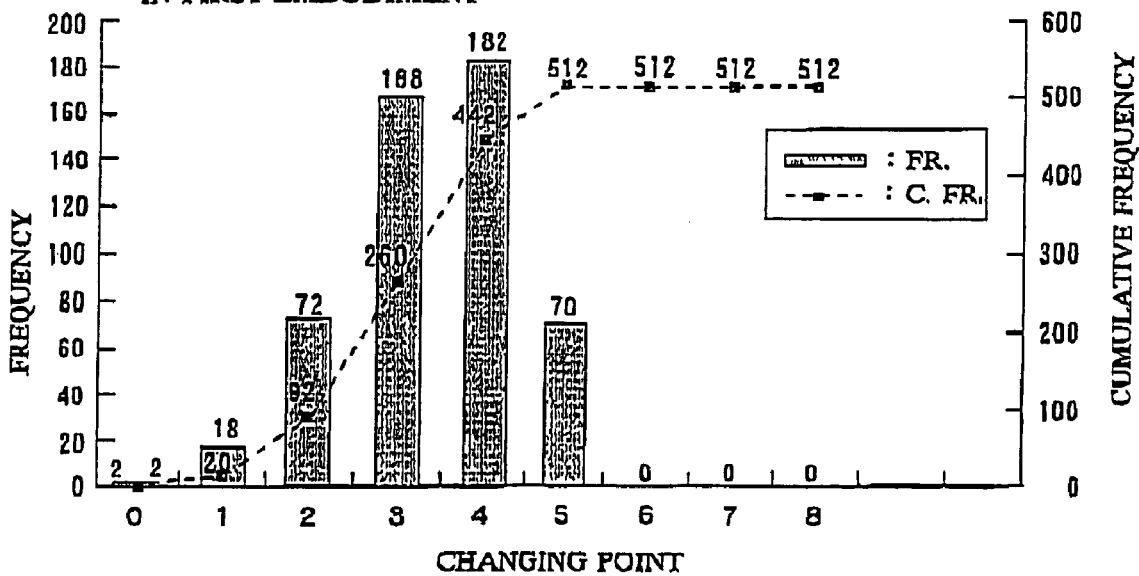
FIG. 8 is a graph showing the frequency and the cumulative frequency of the changing points of a 9-bit data generated by the encoder according to the first embodiment of the invention, where not only the changing points of the 9-bit data but also the changing points generated at the boundary between adjoining 9-bit data are considered.

FIG. 8 is a graph showing the frequency and the cumulative frequency of the changing points of the 9-bit serial code used in the first embodiment, where not only the changing points of the 9-bit code but also the changing points generated at the boundary between adjoining 9-bit codes are considered. The frequency of the changing points is shown in the form of bar graph while the cumulative frequency thereof is shown in the form of line graph.

In the encoder of the first embodiment, the count of the changing points of the 9-bit serial code for the transfer unit is reduced to (M+2)=5 at most. This is seen from FIG. 8, where the count of the changing points of the 9-bit serial code is in the range from 0 to 5.

Subsequently, an average of the changing point count of the respective data is calculated and then, they are compared with each other, clarifying the reduction effect of the changing points of the 9-bit serial code in the first embodiment.

With regard to an ordinary 8-bit data to which no process is added, the count of the changing point is seven and at the same time, the possibility of generation of the changing point is 50%. Therefore, an average of the changing point count of the ordinary 8-bit data is 0.5×7=3.5. On the other hand, with regard to the 9-bit serial code used in the first embodiment, using the distribution in FIG. 7, an average of the changing point count is given as (16+56×2+112×3+70×4)×(1/256)=2.90625≈2.91

This means that the average of the changing point count of the first embodiment is reduced by approximately 16.96% compared with the use of an ordinary 8-bit data.

If not only the changing points of the 9-bit serial code but also the changing points generated at the boundary between adjoining 9-bit codes are considered, an average of the changing point count of an ordinary 9-bit serial code is given as (0.5×8)=4.0. On the other hand, with regard to the 9-bit serial code used in the first embodiment, using the distribution in FIG. 8, an average of the changing point count is given as (18+72×2+168×3+182×4+70×5)×(1/512)
=3.40625≈3.41

This means that the average of the changing point count of the first embodiment is reduced by approximately 14.84% compared with the use of an ordinary 9-bit data.

Finally, a concrete circuit configuration of the encoder of the first embodiment is explained.

The changing-point counting circuit 1 is configured by seven two-input EXOR gates for changing-point detection and an adder circuit for counting the changing points. The code conversion circuit 3 is configured by four NOT gates for bit inversion and four two-input switches for switching between the conversion and non-conversion. Therefore, the encoder according to the first embodiment that outputs an EMI-suppressed 9-bit serial code can be realized with much less circuit components or elements than those of the first prior-art system using the look-up tables. This means that the fabrication cost of the encoder can be lowered.

In addition, since the power consumption is decreased due to the reduced changing points (i.e., reduced change of electric signals), the power consumption of a circuit incorporating the encoder of the first embodiment is lowered.

Second Embodiment

Figure 9:
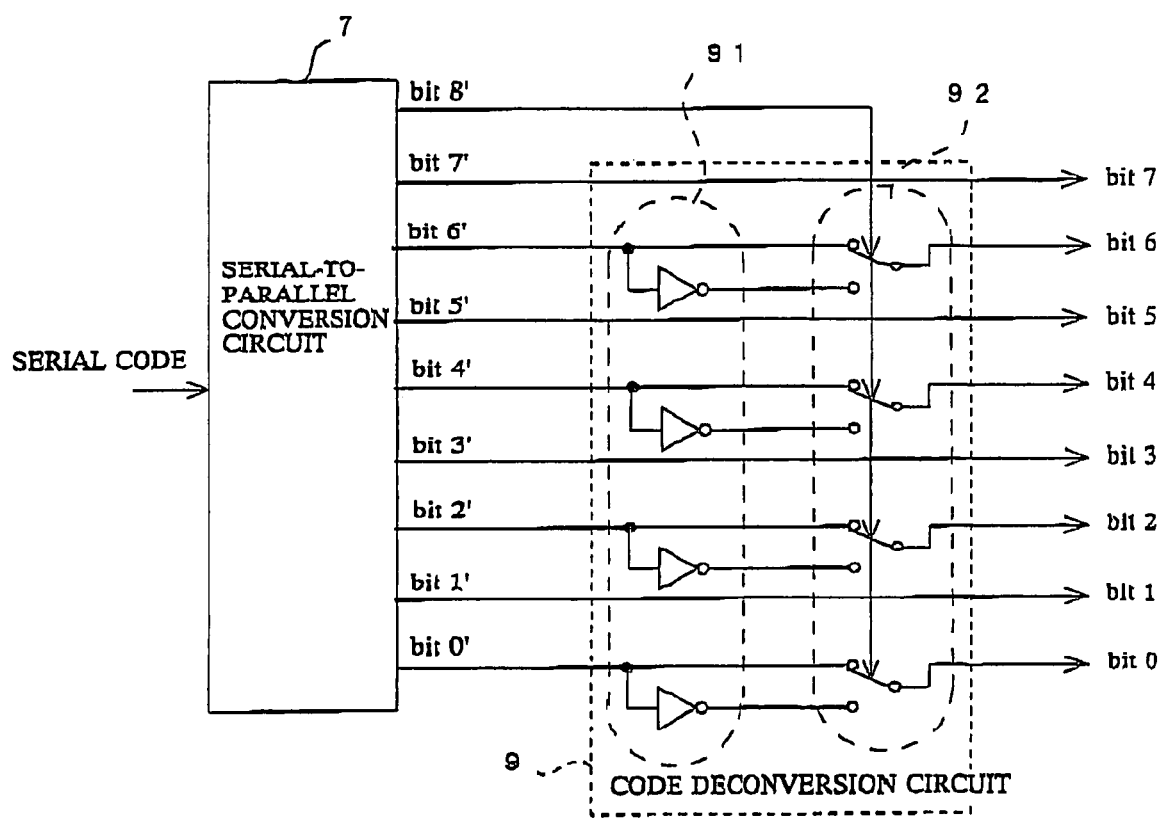
FIG. 9 is a functional block diagram showing the circuit configuration of a decoder according to a second embodiment of the invention.

FIG. 9 is a functional block diagram showing the circuit configuration of a decoder according to a second embodiment of the invention, which decodes the 9-bit serial code outputted from the encoder according to the first embodiment.

As shown in FIG. 9, the decoder of the second embodiment comprises a serial-to-parallel conversion circuit 7 and a code deconversion circuit 9. The serial-to-parallel conversion circuit 7 converts the 9-bit serial code generated and outputted by the encoder according to the first embodiment to a 9-bit parallel data. The code deconversion circuit 9 deconverts the 9-bit parallel data outputted from the serial-to-parallel conversion circuit 7 in such a way that the bits (i.e., bit0', bit2', bit4', and bit6') of the 9-bit parallel data (bit0' to bit8') located at its even-numbered positions, excluding the discrimination bit (bit8'), are inverted when the discrimination bit (bit8') is true.

The code deconversion circuit 9 comprises an inverter circuit 91 having four NOT gates, and a switching circuit 92 having four two-input switches. The inverter circuit 91 inverts the four bits (i.e., bit0', bit2', bit4', and bit6') of the 8-bit data (bit0' to bit7') located at its even-numbered positions with the four NOT gates.

The switching circuit 92 conducts its switching operation in such a way that (i) the even-numbered bits (i.e., bit0', bit2', bit4', and bit6') do not pass through the corresponding NOT gates when the discrimination bit (bit8') has a false value "0", and (ii) the even-numbered bits (i.e., bit0', bit2', bit4', and bit6') pass through the corresponding NOT gates when the discrimination bit (bit8') has a true value "1".

With the decoder according to the second embodiment, the serial-to-parallel conversion circuit 7 converts the 9-bit serial code outputted by the encoder according to the first embodiment of FIG. 2 to the 9-bit parallel data (bit0' to bit8'). When the discrimination bit (bit8') has a false value "0", all the 8-bit parallel data (bit0' to bit7') excluding the discrimination bit (bit8') are outputted from the code deconversion circuit 9 without change or inversion as the 8-bit parallel data (bit0 to bit7). On the other hand, when the discrimination bit (bit8') has a true value "1", the even-numbered bits (i.e., bit0', bit2', bit4', and bit6') excluding the discrimination bit (bit8') are inverted while the odd-numbered bits (i.e., bit1', bit3', bit5', and bit7') are not inverted, resulting in the 8-bit parallel data (bit0 to bit7).

The bit positions at which the bits are inverted by the code deconversion circuit 9 need to be equal to the bit positions at which the bits are converted by the code conversion circuit 3 in the encoder according to the first embodiment of FIG. 2. Thus, the 9-bit serial code transferred from the encoder according to the first embodiment of FIG. 2 can be decoded to the original 8-bit parallel data (bit0 to bit7).

Concretely speaking about the circuit configuration, for example, the code deconversion circuit 9 may be formed by four gates for bit inversion and four two-input switches for switching between the conversion and non-conversion of the bits. Therefore, the decoder according to the second aspect of the invention can be realized with much less circuit components or elements than those of the first prior-art system using the look-up tables. This means that the fabrication cost of the decoder can be lowered.

Third Embodiment

Figure 10:
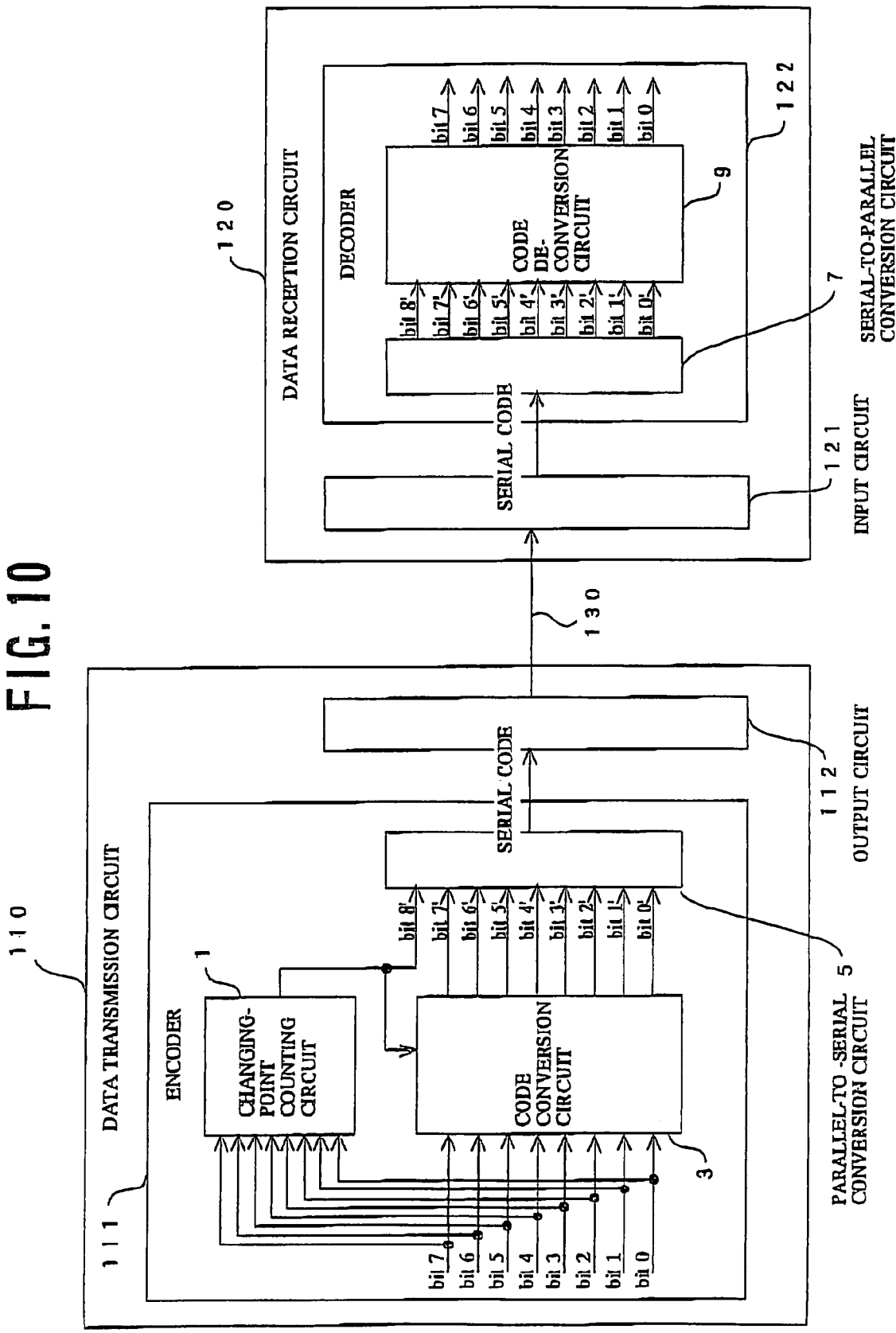
FIG. 10 is a functional block diagram showing the circuit configuration of a data transfer system according to a third embodiment of the invention.

FIG. 10 is a functional block diagram showing the circuit configuration of a data transfer system according to a third embodiment of the invention.

As shown in FIG. 10, the data transfer system comprises a data transmission circuit 110, a data reception circuit 120, and a transmission channel or line 130. The data transmission circuit 110 includes an encoder 111 having the same circuit configuration as that of the above-described encoder 111 according to the first embodiment of FIG. 2. The data reception circuit 120 includes a decoder 122 having the same circuit configuration as that of the above-described decoder according to the second embodiment of FIG. 9.

In the encoder 111 of the data transmission circuit 110, the changing-point counting circuit 1 counts the changing points of the 8-bit data (bit0 to bit7) to generate a counting result, where values of the adjoining bits change at each of the changing points. The circuit 1 outputs the discrimination bit (bit8'), which is true when the counting result exceeds a predetermined value of 3. The code conversion circuit 3 converts the 8-bit data (bit0 to bit7) in such a way that the bits (i.e., bit0, bit2, bit4, and bit6) of the data (bit0 to bit7) located at its even-numbered positions are inverted when the discrimination bit (bit8') is true. The parallel-to-serial conversion circuit 5 generates the 9-bit data (bit0' to bit8') by adding the discrimination bit (bit8') to the output of the code conversion circuit 3 [i.e., the 8-bit data (bit0' to bit7')] as its MSB. The circuit 5 converts the 9-bit data (bit0' to bit8') thus generated to a 9-bit serial code. The 9-bit serial code thus generated is outputted to the transmission line 130 by way of an output circuit 112. The output circuit 112 comprises an output buffer and a control circuit for controlling the data transmission operation.

In the data reception circuit 120, the decoder 122 receives the 9-bit serial code from the transmission line 130 by way of an input circuit 121. The serial-to-parallel conversion circuit 7 of the decoder 122 converts the 9-bit serial code thus received to a 9-bit parallel data. The code deconversion circuit 9 deconverts the 9-bit parallel data outputted from the serial-to-parallel conversion circuit 7 in such a way that the bits (i.e., bit0', bit2', bit4', and bit6') of the 9-bit parallel data (bit0' to bit8') located at its even-numbered positions, excluding the discrimination bit (bit8'), are inverted when the discrimination bit (bit8') is true. Thus, the original 8-bit parallel data (bit0 to bit7) are generated, in other words, the 9-bit serial code received is decoded to the original 8-bit parallel data (bit0 to bit7).

With the data transfer system according to the third embodiment, as explained above, the data transmission circuit 110 outputs the 9-bit serial code having decreased changing points (which is generated from the original 8-bit parallel data), and the data reception circuit 120 receives the 9-bit serial code and decodes the same to the original 8-bit parallel data. Therefore, the high-frequency components of the 9-bit serial code occurring in the serial transmission operation are reduced, thereby effectively suppressing EMI.

Moreover, the encoder 111 of the data transmission circuit 110 and the decoder 122 of the data reception circuit 120 can be realized with much less circuit components or elements than those of the first prior-art system using the look-up tables. Thus, the fabrication cost of the data transfer system according to the third embodiment can be lowered.

Although the discrimination bit (bit8') is added to the 8-bit data (bit0' to bit7') outputted from the code conversion circuit 3 as its MSB in the encoder of the first embodiment, the decoder of the second embodiment, and the data transfer system of the third embodiment, the invention is not limited to this. The discrimination bit (bit8') may be added to the 8-bit data (bit0' to bit7') as its LSB.

Fourth Embodiment

Figure 11:
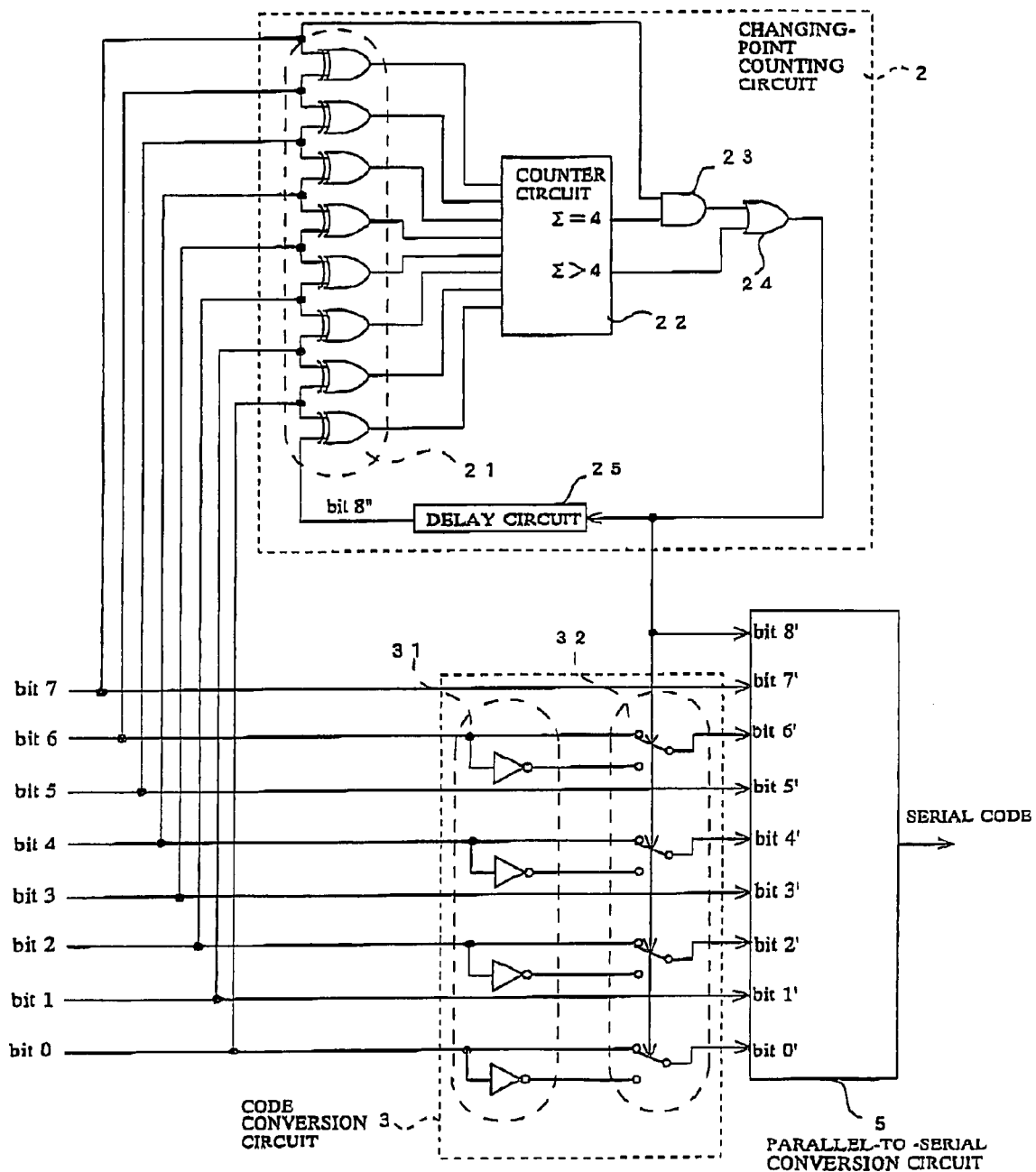
FIG. 11 is a functional block diagram showing the circuit configuration of an encoder according to a fourth embodiment of the invention.

FIG. 11 is a functional block diagram showing the circuit configuration of an encoder according to a fourth embodiment of the invention.

As shown in FIG. 11, the encoder comprises a changing-point counting circuit 2, a code conversion circuit 3, and a parallel-to-serial conversion circuit 5. Since the code conversion circuit 3 and the parallel-to-serial conversion circuit 5 used here are the same in circuit configuration and operation as those of the encoder according to the first embodiment of FIG. 2, the explanation for them is omitted for the sake of simplification. Thus, the changing-point counting circuit 2 will be explained in detail below.

The changing-point counting circuit 2 counts the changing points of the 8-bit data (bit0 to bit7) and the delayed discrimination bit (bit8'') (i.e., which may be termed "detection target data") to generate a counting result, where values of the adjoining bits change at each of the changing points. The circuit 2 outputs the discrimination bit (bit8'), which is true when the counting result of the detection target data exceeds a predetermined value of 4, or when the counting result is equal to the predetermined value of 4 and the MSB of the 8-bit data (bit0 to bit7) has a true value "1".

The changing-point counting circuit 2 includes a changing-point detection circuit 21 having eight two-input exclusive OR (EXOR) gates, a counter circuit 22, a two-input AND gate 23, a two-input OR gate 24, and a delay circuit 25, as shown in FIG. 11.

In the seven EXOR gates of the changing-point detection circuit 21, the two adjoining bits (i.e., bit0 and bit1, bit1 and bit2, bit2 and bit3, bit3 and bit4, bit4 and bit5, bit5 and bit6, and bit6 and bit7) of the 8-bit data are inputted, respectively, thereby detecting whether the two adjoining bits have different values or not. In the additional EXOR gate of the circuit 21 located at the lowest position in FIG. 11, the LSB (i.e., bit0) of the 8-bit data and the discrimination (bit8') are inputted after adding a predetermined time delay by the delay circuit 25, thereby detecting whether these two bits have different values or not.

In other words, the changing-point detection circuit 21 conducts its detection operation for the 9-bit data generated by adding the MSB [i.e., the discrimination bit (bit8')] of the immediately preceding 9-bit serial code (which the said encoder has dealt right before and which has been outputted toward the transmission line 130 in the immediately preceding transfer unit) to the inputted 8-bit data (bit0 to bit7) as its LSB. This means that the detection target data of the circuit 21 is the 9-bit data formed by the inputted 8-bit data (bit0 to bit7) and the delayed discrimination bit 8". Thus, the delay circuit 25 may be realized by a delay circuit having a delaying function to apply a single period defined from the reception of the 8-bit data (bit0 to bit7) by the said encoder to the output of the 9-bit serial code by the said encoder. Alternately, the delay circuit 25 may be realized by a flip-lop that sets the discrimination bit (bit8') at the midpoint of the above period.

The counter circuit 22 receives the outputs of the eight EXOR gates and then, counts the changing points of the 9-bit detection target data [i.e., the data (bit0 to bit7) and the delayed discrimination (bit8")], thereby outputting two counting result signals $\Sigma>4$ and $\Sigma=4$ according to the counting result. The counting result signal $\Sigma>4$ has a true value "1" when the counting result has a value exceeding the predetermined value of 4. The counting result signal $\Sigma=4$ has a true value "1" when the counting result has a value equal to the predetermined value of 4.

For example, if eight 1-bit values are added to each other, the result of addition may have nine values, i.e., "0000", "0001", "0010", "0011", "0100", "0101", "0110", "0111", and "1000". Therefore, the counting result signal $\Sigma=4$ of the counter circuit 22 is obtainable by comparing with the value of "0100". The counting result signal $\Sigma>4$ of the counter circuit 22 is obtainable through logic AND operation between the result of logic OR operation of the bit 2 (third digit) and the bit 3 (fourth digit), and the result of NOT operation of $\Sigma=4$.

The two-input AND gate 23 outputs the result of logic AND operation between the MSB (i.e., bit 7) of the 8-bit data End the counting result signal $\Sigma=4$ of the counting circuit 22.

The two-input OR gate 24 outputs the result of logic OR operation between the output of the AND gate 23 and the counting result signal $\Sigma>4$ of the counting circuit 22. The output of the gate 23 is the discrimination bit (bit8') as the output of the changing-point counting circuit 2.

As explained above, the discrimination bit (bit8') is true when the counting result of the 9-bit detection target data exceeds the predetermined value of 4, or when the counting result is equal to the predetermined value of 4 and the MSB (i.e., bit 7) of the 8-bit data (bit0 to bit7) has a true value "1".

Next, the operation principle (e.g., the condition for generating the discrimination bit (bit8'), and the arrangement of the 9-bit serial code) of the encoder according to the fourth embodiment is explained below. In addition, the reducing effect of the changing points in the 9-bit serial code is referred based on statistical analysis.

In the encoder of the fourth embodiment, as described above, the detection target data of the changing-point counting circuit 2 is the 9-bit data formed by the 8-bit data (bit0 to bit7) and the delayed discrimination bit (bit8). Therefore, from the above-described Property 2, if the 9-bit data having eight changing points is alternately inverted, the changing point count after this inversion is 0. Similarly, if the 9-bit data having seven changing points is alternately inverted, the changing point count after this inversion is 1. If the 9-bit data having seven changing points is alternately inverted, the changing point count after this inversion is 1. If the 9-bit data having six changing points is alternately inverted, the changing point count after this inversion is 2. If the 9-bit data having five changing points is alternately inverted, the changing point count after this inversion is 3. If the 9-bit data having four changing points is alternately inverted, the changing point count after this inversion is 4. If the 9-bit data having three, two, one, or zero changing point(s) is alternately inverted, the changing point count after this inversion is 5, 6, 7, or 8, respectively.

In the encoder of the fourth embodiment, n=8. However, the detection target data is expanded by one bit to 9-bit data. Thus, the predetermined value M' for the changing-point counting circuit 2 is set at 4, because $(\frac{1}{2}) \times (n+1) = 4.0$. The even-numbered bits (i.e., bit0, bit2, bit4, and bit6) of the 8-bit data (bit0 to bit7) are inverted while the odd-numbered bits (i.e., bit1, bit3, bit5, and bit7) thereof are not inverted.

It should be noted that the odd-numbered bits of the 9-bit data (i.e., bit0 to bit7 and bit8") are inverted, and that the MSB (i.e., bit8") of the immediately preceding 9-bit serial code and the MSB (i.e., bit7) of the inputted 8-bit data are not inverted in the code conversion circuit 3. Specifically, when the count of the changing points of the 9-bit data (i.e., bit0 to bit7 and bit8") is in the range of 0 to 4, the code conversion circuit 3 does not conduct its conversion operation and thus, the count of the changing points of the 8-bit data (bit0' to bit7') is kept unchanged. On the other hand, when the count of the changing points of the 9-bit data (i.e., bit0 to bit7 and bit8") is in the range of 5 to 8, the code conversion circuit 3 conducts its conversion operation and thus, the count of the changing points of the 8-bit data (bit0' to bit7') is reduced to the range of 0 to 3. Therefore, the count of the changing points of the 8-bit data (bit0' to bit7') is reduced to M' of 4 at most.

A concrete example of the 9-bit serial code generated by the encoder of the fourth embodiment of FIG. 11 is shown in FIGS. 12A and 12B. In the following explanation, the word "transfer" is used, because the 9-bit serial code generated by the said encoder will be usually used for a data transfer system as its transmission-side subsystem.

FIG. 12A shows four transfer units of a 8-bit serial code (bit0 to bit7) generated by simple parallel-to-serial conversion, where the transfer unit is 8 bits. FIG. 12B shows four units of the 9-bit serial code (bit0' to bit8') generated by the encoder of the fourth embodiment, where the transfer unit is 9 bits.

Comparing the counts of the changing points of these two data, 0, 1, 7, and 3 are seen from the first to fourth transfer units in FIG. 12A. Two changing points are additionally generated at the boundaries of the first to fourth transfer units. As a result, the count of the changing points of the 8-bit data in FIG. 12A is 13 in total. On the other hand, 0, 1, 0, and 4 are seen from the first to fourth transfer units in FIG. 12B. Three changing points are additionally generated at the boundaries of the first to fourth transfer units. As a result, the count of the changing points of the 9-bit data in FIG. 12B is 7 in total. Thus, in the encoder of the fourth embodiment of the invention, the count of the changing points is decreased from 13 to 7.

With the encoder of the first embodiment of FIG. 2, as explained above, the predetermined value M for the changing-point counting circuit 1 is set at 3, and the even-numbered bits (i.e., bit0, bit2, bit4, and bit6) of the 8-bit data (bit0 to bit7) are inverted while the odd-numbered bits (i.e., bit1, bit3, bit5, and bit7) thereof are not inverted. Thus, the count of the changing points of the 8-bit data (bit0' to bit7') outputted from the code conversion circuit 3 is reduced to M=3 at most. Moreover, because the discrimination bit (bit8') is added to the 8-bit data (bit0' to bit7') outputted from the circuit 3 as its MSB, the count of the changing points of the 9-bit serial code (bit0' to bit8') is reduced to (M+1)=4 at most, and the count of the changing points of the 9-bit serial code for the transfer unit is reduced to (M+2)=5 at most.

On the other hand, with the encoder of the fourth embodiment of FIG. 11, the 9-bit data formed by the 8-bit data (bit0 to bit7) and the delayed discrimination bit (bit8") is used as the detection target data of the changing-point counting circuit 2. The predetermined value M' for the changing-point counting circuit 2 is set at 4, which is the largest integer in the range of 4.0 [=(½)n] or less. Moreover, the discrimination bit (bit8') is set to be true when the counting result of the 9-bit detection target data exceeds the predetermined value of 4, or when the counting result is equal to the predetermined value of 4 and the MSB (i.e., bit 7) of the 8-bit data (bit0 to bit7) has a true value "1". When the discrimination bit bit8' is set to be true, the even-numbered bits (i.e., bit0, bit2, bit4, and bit6) of the 8-bit data (bit0 to bit7) are inverted while the odd-numbered bits (i.e., bit1, bit3, bits, and bit7) thereof are not inverted, thereby reducing the count of the changing points of the 8-bit data (bit0' to bit7') to M'=4 at most. Then, the count of the changing points of the 9-bit serial code (bit0' to bit8') is reduced to M'=4 at most, and the count of the changing points of the 9-bit serial code for the transfer unit is reduced to M'=4 at most.

In the encoder of the fourth embodiment, the count of the changing points of the 9-bit serial code for the transfer unit is not increased by one compared with the count of the changing points of the 9-bit serial code (bit0' to bit8'), which is unlike the first embodiment. This is because the 9-bit data formed by the 8-bit data (bit0 to bit7) and the delayed discrimination bit (bit8") is used as the detection target data of the changing-point counting circuit 2. In other words, a changing point formed at a transfer unit boundary is an uncontrollable changing point in the first embodiment; unlike this, a changing point formed at a transfer unit boundary is included in the detection target data and therefore, this changing point can be made a controllable one in the fourth embodiment.

Furthermore, in the encoder of the fourth embodiment, the count of the changing points of the 9-bit serial code for the transfer unit is not increased by one compared with the count of the 8-bit data (bit0' to bit7'), which is unlike the first embodiment. This is because the following condition is added. "The discrimination bit (bit8') is set to be true when the counting result is equal to the predetermined value M' of 4, and the MSB (i.e., bit 7) of the 8-bit data (bit0 to bit7) has a true value "1"."

Specifically, a changing point formed at a bit boundary between the 8-bit data (bit0' to bit7') and the discrimination bit (bit8') is an uncontrollable changing point in the first embodiment. In the fourth embodiment, unlike this, the circuit configuration is designed in such a way that no changing point is formed at this bit boundary and therefore, a controllable changing point is formed at this bit boundary.

The above-described condition added is paradoxically derived in the following way.

First, the count of the changing point of the 9-bit serial code (bit0' to bit8') is equal to (M'+1) only when the counting result of the changing-point counting circuit 2 is equal to the predetermined value M'. At this time, the counting result does not exceed M' and therefore, the value of the discrimination bit (bit8') should be false, i.e., "0". In the fourth embodiment, the discrimination bit (bit8') is placed at the MSB of the 9-bit data (bit0' to bit8'). Thus, a changing point is generated at the bit boundary between the MSB of the 9-bit data and the discrimination bit (bit8') under the condition that the MSB (bit7') has a true value "1" [because the value of the discrimination bit (bit8') is false] On the other hand, the bit number of the detection target data (bit0 to bit7 and bit8") is 9 (=n+1), which is an odd number. Thus, when the counting result of the changing-point counting circuit 2 is equal to the predetermined value M'=4, the count of the changing point is kept at 4 regardless of whether the conversion operation by the code conversion circuit 3 is conducted or not.

Accordingly, in the case that the MSB (bit7) of the 8-bit data (bit0 to bit7) is not included in the bit inversion target by the code conversion circuit 3, if the discrimination bit bit8' is set to be true when the counting result is equal to the predetermined value M' of 4 and the MSB (bit 7) of the 8-bit data (bit0 to bit7) has a true value "1", no changing point will be formed at the bit boundary between the MSB (bit7') of the 8-bit data (bit0' to bit7') and the discrimination bit (bit8') (This is because the value of the MSB (bit7') of the 8-bit data (bit0' to bit7') is kept true even if the bit inversion is conducted by the code deconversion circuit 3.) As a result, the count of the changing points of the 9-bit serial code (bit0' to bit8') can be reduced to M'=4 at most.

This reason is explained in more detail using a concrete example below.

Assuming that the 9-bit data having a count of changing point of 4 is "001100110" [MSB (bit7)=0], the bit inversion is not conducted by the code conversion circuit 3 and therefore, the post-inversion 9-bit data is the same as the original 9-bit data, i.e., "001100110". This means that no changing point is additionally formed and thus, the count of changing point of 4 is kept unchanged, even if the discrimination bit (bit8') (=0) is added to the MSB side. Also, assuming that the 9-bit data having a count of changing point of 4 is "101100111" [MSB (bit7)=1], the bit inversion is conducted by the code conversion circuit 3, resulting in the post-inversion 9-bit data of "111001101". This means that no changing point is additionally formed and thus, the count of changing point of 4 is kept unchanged, even if the discrimination bit (bit8') (=1) is added to the MSB side.

In addition, as explained above, in order to make a controllable changing point at the bit boundary between the 8-bit data (bit0' to bit7') and the discrimination bit (bit8'), the following premises are necessary for the additional condition that "the discrimination bit (bit8') is set to be true when the counting result is equal to the predetermined value M' of 4, and the MSB (i.e., bit 7) of the 8-bit data (bit0 to bit7) has a true value "1"."

[Premise 1]
The discrimination bit (bit8') is placed at the MSB of the 9-bit data (bit0' to bit8').

[Premise 2]
The bit number of the detection target data of the changing-point detection circuit 2 is odd.

[Premise 3]
The MSB (bit7) of the 8-bit data (bit0 to bit7) is not included in the bit inversion target of the code conversion circuit 3.

Regarding Premise 2, it should be noted that if the bit number of the detection target data of the changing-point detection circuit 2 is "even", there is no state where the count of changing point of the 8-bit data (bit0 to bit7) does not change regardless of whether the code deconversion is conducted by the code deconversion circuit 3 or not.

Next, the reducing effect of the changing point in the 9-bit serial code in the encoder of the fourth embodiment will be explained based on statistical analysis.

Figure 13:
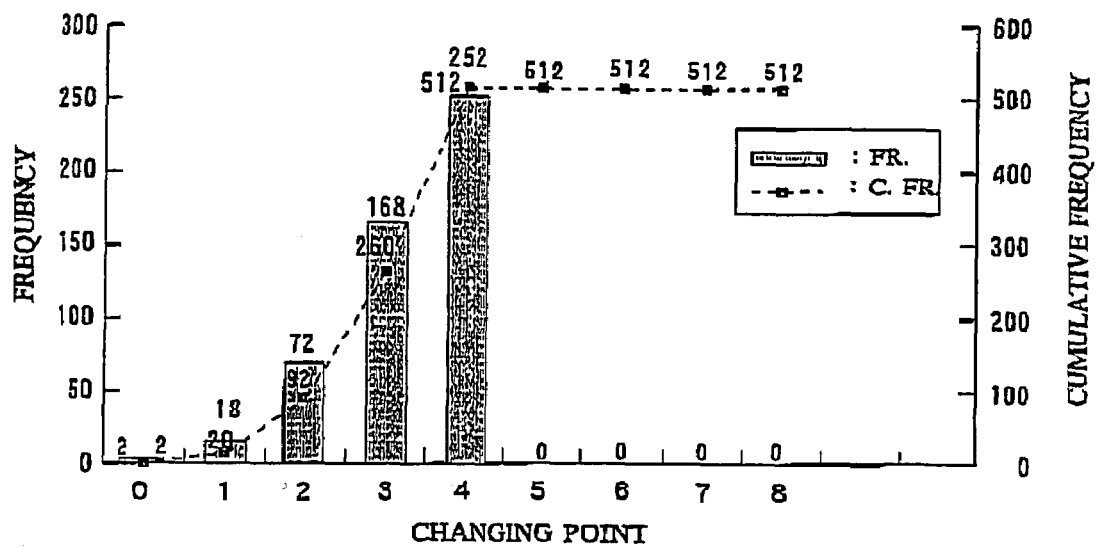
FIG. 13 is a graph showing the frequency and the cumulative frequency of the changing points of a 9-bit serial code generated by the encoder according to the fourth embodiment of the invention, where not only the changing points of the 9-bit serial code but also the changing points generated at the boundary between adjoining 9-bit serial code are considered.

FIG. 13 is a graph showing the frequency and the cumulative frequency of the changing points of a 9-bit serial code generated by the encoder according to the fourth embodiment of the invention, where not only the changing points of the 9-bit serial code but also those generated at the boundary between adjoining 9-bit serial code are considered. The frequency of the changing points is shown in the form of bar graph while the cumulative frequency thereof is shown in the form of line graph.

In the encoder of the fourth embodiment, as described above, the count of the changing points of the 9-bit serial code for the transfer unit is reduced to M'=4 at most. This is seen from FIG. 13, where the count of the changing points of the 9-bit serial code is in the range from 0 to 4.

Subsequently, an average of the changing point count of the respective data is calculated and then, they are compared with each other, clarifying the reduction effect of the changing points of the 9-bit serial code in the fourth embodiment.

With regard to an ordinary 8-bit data to which no process is added, when not only the changing points of the 8-bit data but also those generated at the boundary between adjoining 8-bit data are considered, an average of the changing point count of the ordinary 8-bit data is 0.5×8=4.0. On the other hand, with regard to the 9-bit serial code used in the fourth embodiment, using the distribution in FIG. 13, an average of the changing point count is given as (18+72×2+168×3+252×4)×(1/512)=3.2695≈3.27

This means that the average of the changing point count of the fourth embodiment is reduced by approximately 18.26% compared with the use of an ordinary 8-bit data including the changing points generated at the boundary between adjoining 8-bit data.

Figure 14:
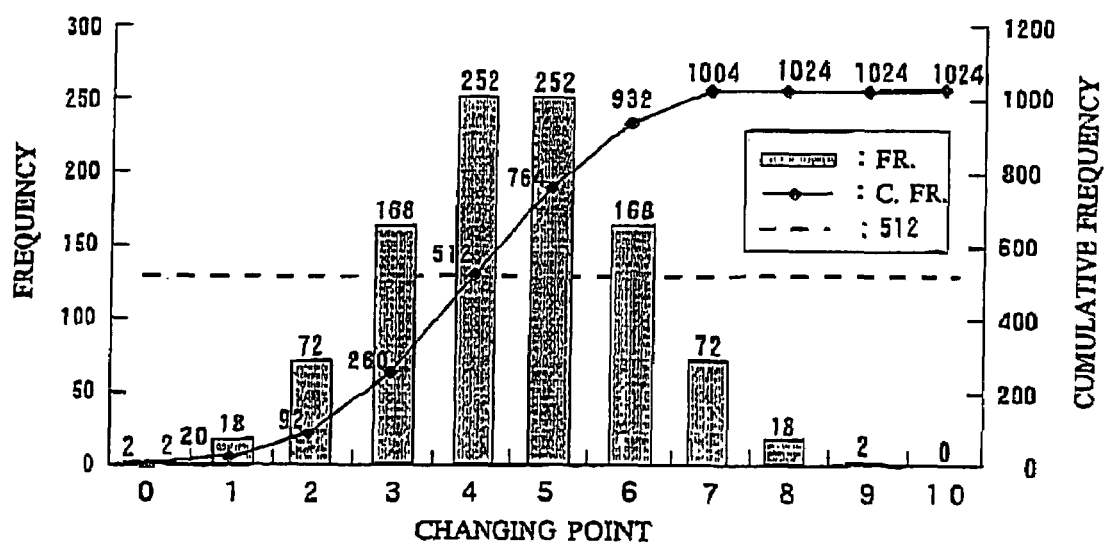
FIG. 14 is a graph showing the frequency and the cumulative frequency of the changing points of a 10-bit ordinary data to which no process is applied.

FIG. 14 is a graph showing the frequency and the cumulative frequency of the changing points of an ordinary 10-bit data, to which the code converter used in the encoder according to the fourth embodiment is not applied. The frequency of the changing points is shown in the form of bar graph while the cumulative frequency thereof is shown in the form of line graph.

It is seen from FIG. 14 that the distribution (FIG. 13) of the changing points of the 9-bit serial code generated by the encoder according to the fourth embodiment is in accordance with the left-side half of the distribution of an ordinary 10-bit data in FIG. 14. Therefore, it is said that the configuration of the fourth embodiment forms a limit of the method of reducing the changing points by converting a 8-bit data to a 9-bit one.

Finally, a concrete circuit configuration of the encoder of the fourth embodiment is explained.

As shown in FIG. 11, the changing-point counting circuit 2 is configured by eight two-input EXOR gates for changing-point detection, an adder circuit for counting the changing points, a two-input AND gate, and a two-input OR gate. The code conversion circuit 3 is configured by four NOT gates for bit inversion and four two-input switches for switching between the conversion and non-conversion. Therefore, the encoder according to the fourth embodiment that outputs an EMI-suppressed 9-bit serial code can be realized with much less circuit components or elements than those of the first prior-art system using the look-up tables. This means that the fabrication cost of the encoder can be lowered.

In addition, since the power consumption is decreased due to the reduced changing points (i.e., reduced change of electric signals), the power consumption of a circuit incorporating the encoder of the fourth embodiment is lowered.

In the above-described encoders of the first and fourth embodiments, the code conversion circuit 3 inverts the 8-bit data (bit0 to bit7) in such a way that the bits (i.e., bit0, bit2, bit4, and bit6) of the 8-bit data located at its even-numbered positions are inverted when the discrimination bit (bit8') is true. However, the code conversion circuit 3 may invert the 8-bit data in such a way that the bits (i.e., bit1, bit3, bit5, and bit7) of the 8-bit data located at its odd-numbered positions are inverted when the discrimination bit (bit8') is true.

Similarly, in the above-described encoder of the second embodiment, when the discrimination bit (bit8') is true, the code deconversion circuit 9 deconverts the 9-bit data (bit0' to bit8') in such a way that the bits (i.e., bit0', bit2', bit4', and bit6') of the 8-bit data, excluding the discrimination bit (bit8'), located at its even-numbered positions are inverted. However, the code deconversion circuit 9 may invert the 9-bit data in such a way that the bits (i.e., bit1', bit3', bit5', and bit7') of the 8-bit data, excluding the discrimination bit (bit8'), located at its odd-numbered positions may be inverted.

Furthermore, when these encoder and decoder are used in combination, like the above-described data transfer system of the third embodiment, the bit inversion positions need to be accorded between the encoder and the decoder.

Fifth Embodiment

Figure 15:
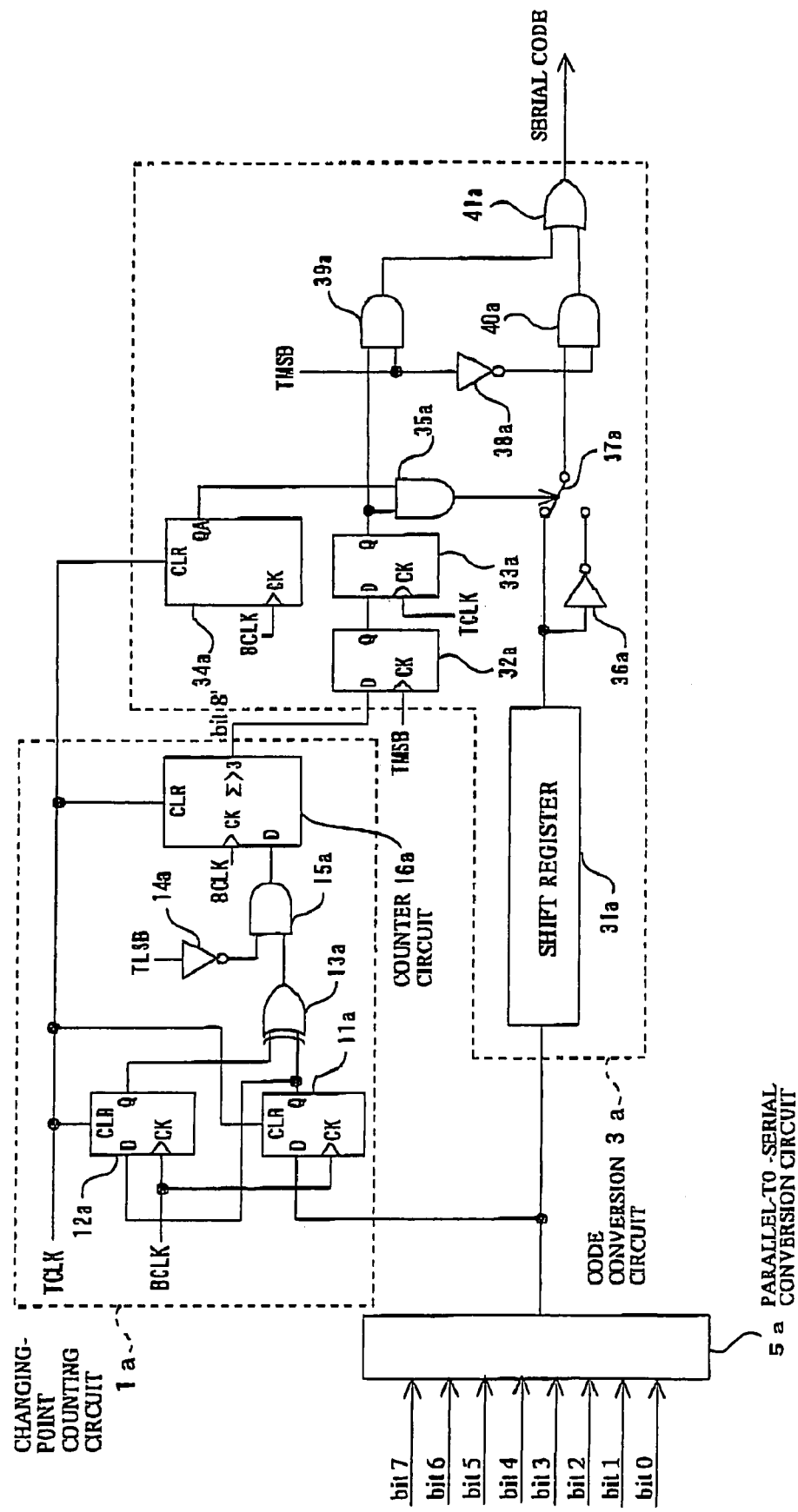
FIG. 15 is a functional block diagram showing the circuit configuration of an encoder according to a fifth embodiment of the invention.

FIG. 15 is a functional block diagram showing the circuit configuration of an encoder according to a fifth embodiment of the invention.

As shown in FIG. 15, the encoder comprises a parallel-to-serial conversion circuit 5*a*, a changing-point counting circuit 1*a*, and a code conversion circuit 3*a*.

In the above-described encoders of the first and second embodiments, the changing points of the 8-bit parallel data are counted by the changing-point counting circuit 1 or 2 to form the discrimination bit (bit8') and then, the data is subjected to the code conversion operation by the code conversion circuit 3 and the conversion by the parallel-to-serial conversion circuit 5, thereby outputting the 9-bit serial code. Unlike this, in the encoder of the fifth embodiment of FIG. 15, first, the 8-bit parallel data is subjected to the parallel-to-serial conversion by the parallel-to-serial conversion circuit 5*a* to form 8-bit serial data. Thereafter, the changing points of the 8-bit serial data thus formed are counted by the changing-point counting circuit 1*a* to form the discrimination bit (bit8') and then, the data is subjected to the code conversion operation by the code conversion circuit 3*a*, thereby outputting the 9-bit serial code to which the discrimination bit (bit8') was added.

In this way, in the encoder of the fourth embodiment, the processes are applied to the 8-bit "serial" data and therefore, they need to be carried out in two different stages, i.e., the first and second time stage. In the first time stage, the parallel-to-serial conversion by the parallel-to-serial conversion circuit 5*a*, the detection and counting of the changing points by the changing-point counting circuit 1*a*, and the formation of the discrimination bit (bit8') are carried out. In the second time stage, the bit inversion and code output by the code conversion circuit 3a is carried out. Timing control for each bit needs to be conducted in each of these two stages.

Accordingly, here, a "transfer period clock TCLK" is applied as the timing signal for defining the first or second time stage, and a "bit clock BCLK" is applied as the timing signal for defining bit processing time per bit. In the fifth embodiment, 9-bit serial code is generated and therefore, nine bit clocks BCLK correspond to one transfer period clock TCLK. Moreover, a signal TLSB for showing the processing time for the LSB of the 9-bit data in one time stage, and a signal TMSB for showing the processing time for the MSB of the 9-bit data in one time stage are also applied. These timing signals are required for, for example, data transmission of the 9-bit serial code outputted from the encoder of the fifth embodiment. Since these timing signals are usually generated in the output circuit of the data transfer system or the like, any other dedicated circuit for generating these signals is unnecessary.

The parallel-to-serial conversion circuit 5a converts the inputted 8-bit parallel data to 8-bit serial data, in which a dummy bit (not shown) corresponding to the discrimination bit is added to ensure the time for inserting the discrimination bit. Thus, the output of the circuit 5a is 9-bit data including the 8-bit serial data (which corresponds to the inputted 8-bit parallel data) and the dummy bit.

The changing-point counting circuit 1a comprises two flip-flops 11a and 12a, a two-input EXOR gate 13a for detecting the changing points, a counter circuit 16a for counting the changing points, and a NOT gate 14a and a two-input AND gate 15a for prohibiting the counting operation in the LSB processing time.

In the changing-point counting circuit 1a, the 8-bit serial data (bit0 to bit7) and the dummy are successively supplied to the bit flip-flops 11a and 12a according to the bit clock BCLK. Thus, in each of the bit processing times excluding the LSB processing time, the two adjoining bits (i.e., bit0 and bit1, bit1 and bit2, bit2 and bit3, bit3 and bit4, bit4 and bits, bits and bit6, bit6 and bit7, and bit7 and bit8) of the 9-bit data are successively held in the flip-flops 11a and 12a. By conducting an EXOR operation between the outputs of the two flip-flops 11a and 12a by the EXOR gate 13a, the changing point between the adjoining bits is detected. The count of the changing points of the 8-bit serial data (bit0 to bit7) is obtained by the counter circuit 12 by counting the output of the EXOR gate 13a in each of the bit processing times excluding the LSB processing time according to the bit clock BCLK, thereby outputting the discrimination bit (bit8'). If the counting result of the counter circuit 12 has a value exceeding the predetermined value of 3, the discrimination bit (bit8') has a true value "1".

The code conversion circuit 3a comprises a shift register 31a for successively outputting the 8-bit serial data (bit0' to bit7') and the dummy bit, two flip-flops 32a and 33a for holding the discrimination bit (bit8'), a counter 34a for outputting a parity signal, a two-input AND gate 35a, a NOT gate 36a for bit inversion, a two-input switch 37a for switching between conversion and non-conversion, and a group of gates (a NOT gate 38a, two two-input AND gates 39a and 40a, and a two-input OR gate 41a) for outputting a serial code by adding the discrimination bit (bit8') to the 8-bit data (bit0' to bit7') instead of the dummy bit.

In the code conversion circuit 3a, at the initial timing in the current time stage, the 8-bit serial data (bit0' to bit7') that was dealt by the changing-point counting circuit 1a in the prior time stage is held in the shift register 31a. The discrimination bit (bit8'), which was held in the flip-flop 32a in the MSB processing time in the prior time stage, is held in the flip-flop 33a at the initial timing in the current time stage. This means that the shift register 31a and the flip-flops 32a and 33a serve as a "data holding means" required for realizing data processing over the two time stages.

The counter 34a counts the bit clock BCLK and hold the information that which digit of the 8-bit serial data (bit0' to bit7') is processed by the code conversion circuit 3a. Thus, the first digit of the output of the counter 34a can be used as a signal for indicating the even- or odd-numbered location of the 8-bit serial data. In the fifth embodiment, like the first embodiment, the even-numbered bits (bit0, bit2, bit4, and bit6) of the 8-bit serial data are inverted and therefore, the negative logic signal of the first digit of the output of the counter 34a is used as the "even-number signal". (As explained previously, the first digit of n-bit bit data is defined as bit0 in this specification.)

The two-input AND gate 35a conducts a logic AND operation between the discrimination bit (bite') and the even-number signal. According to the output of the gate 35a, the operation of the switch 37a is controlled in such a way that the output of the shift register 31a is subjected to bit inversion or not. Thus, if the discrimination bit (bit8') has a true value "1", the switch 37a outputs the 8-bit serial data (bit0' to bit7') after inverting the even-numbered bits (bit0, bit2, bit4, and bit6) of the 8-bit serial data. If the discrimination bit (bit8') has a false value "0", the switch 37a outputs the 8-bit serial data (bit0' to bit7') without bit inversion.

By the two-input AND gate 40a, the output time of the 8-bit serial data (bit0' to bit7') is limited in the period excluding the MSB processing time. The 8-bit serial data (bit0' to bit7') is then outputted through the two-input OR gate 41a as the first to eight digits of the 9-bit serial code. On the other hand, by the two-input AND gate 40a, the output time of the discrimination bit (bit8') is limited in the MSB processing time. The discrimination bit (bit8') is then outputted through the two-input OR gate 41a as the ninth digit (i.e., MSB) of the 9-bit serial code. In this way, the 9-bit serial code as the output of the encoder of the fifth embodiment is formed by the combination of the 8-bit serial data (bit0' to bit7') and the discrimination bit (bit8').

With the encoder of the fifth embodiment of FIG. 15, like the encoder of the first embodiment, the changing-point counting circuit 1a counts the changing points of the 8-bit data (bit0 to bit7) to generate the counting result. When the counting result exceeds the predetermined value M of 3, the 8-bit data is alternately inverted by the code deconversion circuit 3a. Therefore, the count of the changing points of the 8-bit data is reduced to M of 3 at most. As a result, the encoder according to the fifth embodiment that outputs an EMI-suppressed 9-bit serial code can be realized with much less circuit components or elements than those of the first prior-art system using the look-up tables. This means that the fabrication cost of the encoder can be lowered.

With regard to a concrete circuit configuration of the encoder of the fifth embodiment, unlike the encoder of the first embodiment of FIG. 2, the 8-bit serial code is processed. Thus, the processes by the changing-point counting circuit 1a and the code conversion circuit 3a need to be carried out in two different stages (i.e., the first and second time stage) and moreover, timing control for each bit needs to be conducted in each of these two stages. Accordingly, necessary circuit components or elements will be larger than the first embodiment. Nonetheless, the encoder of to the fifth embodiment that outputs an EMI-suppressed 9-bit serial code can be realized with much less circuit components or elements than those of the first prior-art system using the look-up tables. This means that the fabrication cost of the decoder can be lowered.

In addition, since the power consumption is decreased due to the reduced changing points (i.e., reduced change of electric signals), the power consumption of a circuit incorporating the encoder of the fifth embodiment is lowered.

Sixth Embodiment

Figure 16:
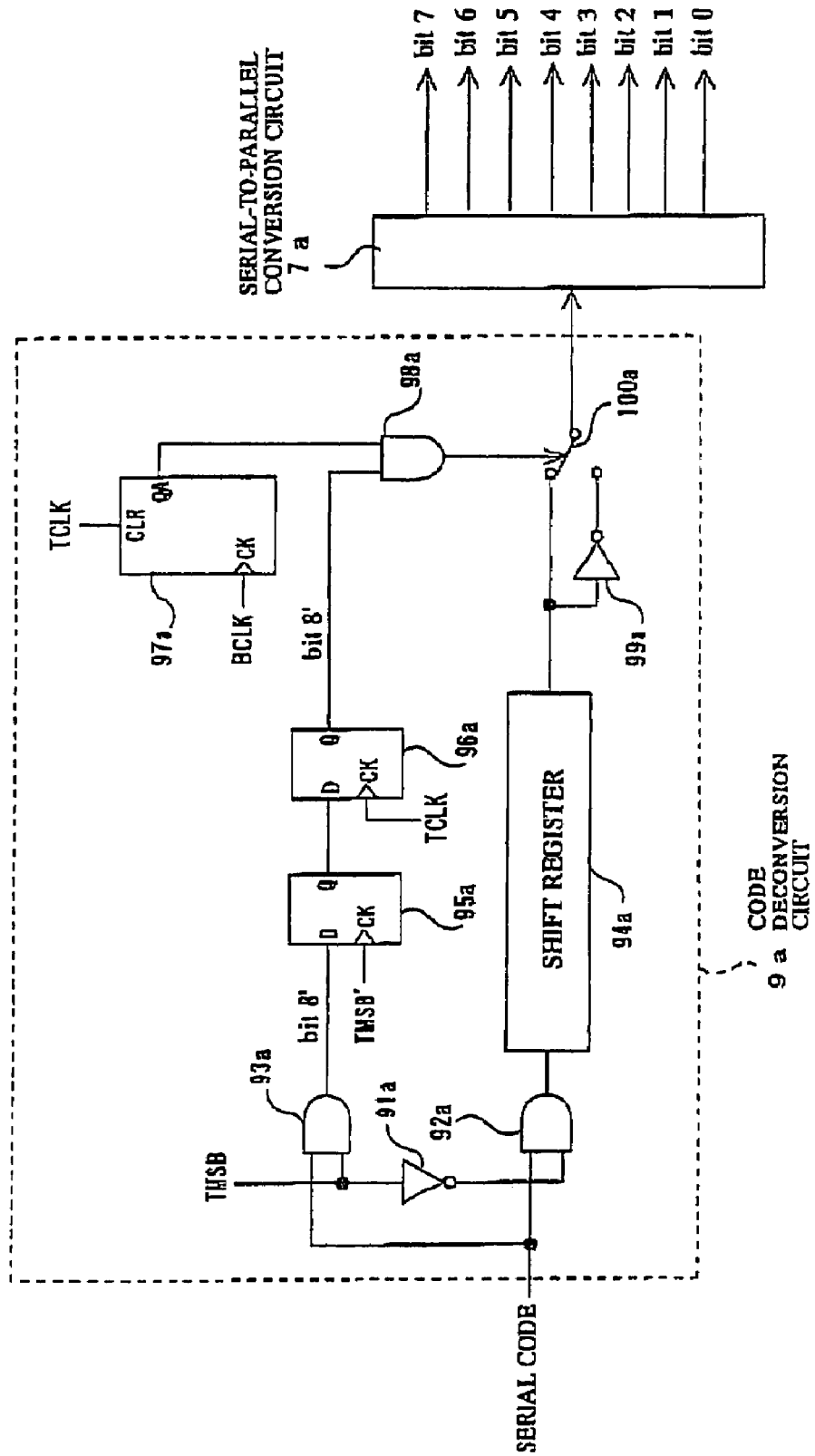
FIG. 16 is a functional block diagram showing the circuit configuration of a decoder according to a sixth embodiment of the invention.

FIG. 16 is a functional block diagram showing the circuit configuration of a decoder according to a sixth embodiment of the invention, which decodes the 9-bit serial code outputted from the encoder according to the first, forth, or fifth embodiment.

As shown in FIG. 16, the decoder of the sixth embodiment comprises a code deconversion circuit 9a and a serial-to-parallel conversion circuit 7a. The code deconversion circuit 9a deconverts the 9-bit serial data (bit0' to bit8') outputted from the encoder in such a way that the even-numbered bits (i.e., bit0', bit2', bit4', and bit6') of the 9-bit serial data, excluding the discrimination bit (bit8'), are inverted when the discrimination bit is true. The serial-to-parallel conversion circuit 7a converts the 8-bit serial data generated and outputted by the circuit 9a to a 8-bit parallel data.

In the decoder of the above-described second embodiment, the 8-bit parallel data converted by the serial-to-parallel conversion circuit 7 is subjected to the code deconversion operation by the code deconversion circuit 9, outputting the 8-bit parallel data. Unlike this, in the decoder of the sixth embodiment of FIG. 16, the 8-bit serial data of the 9-bit serial data excluding the discrimination bit is subjected to the code deconversion operation by the coder deconversion circuit 9a and thereafter, it is subjected to the operation by the serial-to-parallel conversion circuit 7a, outputting the 8-bit parallel data.

Furthermore, in the decoder of the sixth embodiment, the processes are applied to the 9-bit "serial" code including the 8-bit data and the discrimination bit (bit8') added as its MSB and therefore, they need to be carried out in two different stages, i.e., the first and second time stage. In the first time stage, the 8-bit data and the discrimination bit (bit8') of the 9-bit serial code are separated from each other and held in the data holding means. In the second time stage, the bit inversion by the bit deconversion circuit 9a, and conversion by the serial-to-parallel conversion circuit 7a is carried out.

Thus, like the decoder of the above-described fifth embodiment, a "transfer period clock TCLK" is applied as the timing signal for defining the first or second time stage, a "bit clock BCLK" is applied as the timing signal for defining bit processing time per bit, and a signal TMSB for showing the processing time for the MSB of the 9-bit data in one time stage is also applied.

The code deconversion circuit 9a comprises a group of gates (a NOT gate 91a and two two-input AND gates 92a and 93a) for separating the 8-bit serial data (bit0' to bit7') and the discrimination bit (bit') from the inputted 9-bit serial code and outputting the same. The circuit 9a further comprises a shift register 94a for successively outputting the 8-bit serial data, two flip-flops 95a and 96a for holding the discrimination bit, a counter 97a for outputting a parity signal, a two-input AND gate 98a, a NOT gate 99a for bit inversion, and a two-input switch 10a for switching between conversion and non-conversion.

In the first time stage, while the output time of the inputted 9-bit serial code (bit0' to bit8') is limited in the period excluding the MSB processing time by the two-input AND gate 92a, the 8-bit -serial data (bit0' to bit7') of the 9-bit serial code is received by the shift register 94a. On the other hand, while the output time of the discrimination bit (bit8') is limited in the MSB processing time by the two-input AND gate 40a, the discrimination bit (bit8') is received by the flip-flop 95a.

As seen from FIG. 16, a signal "TMSB'" is used as the timing signal of setting the discrimination bit (bit1'). The signal "TMSB'" is a delayed signal generated by adding a delay corresponding to the signal propagation delay of the two-input AND gate 93a to the signal TMSB. The use of the signal "TMSB'" is to cope with the design of timing.

In the second time stage, at the initial timing of the current time stage, the 8-bit serial data (bit0, to bit7') of the 9-bit serial code that was inputted in the prior time stage is held in the shift register 94a. The discrimination bit (bit8'), which was held by the flip-flop 95a in the MSB processing time in the prior time stage, is held in the flip-flop 96a at the initial timing of the current time stage.

The counter 97a counts the bit clock BCLK and hold the information that which digit of the 8-bit serial data (bit0' to bit7') is processed by the code deconversion circuit 3a. Thus, the first digit of the output of the counter 97a can be used as a signal for indicating the even- or odd-numbered location of the 8-bit serial data. In the sixth embodiment, corresponding to the encoder of the first, fourth, or fifth embodiment, the even-numbered bits (bit0, bit2, bit4, and bit6) of the 8-bit serial data are inverted and therefore, the negative logic signal of the first digit of the output of the counter 97a is used as the "even-number signal".

The two-input AND gate 98a conducts a logic AND operation between the discrimination bit (bit8') and the even-number signal. According to the output of the gate 98a, the operation of the switch 100 is controlled in such a way that the output of the shift register 94a is subjected to bit inversion or not. Thus, if the discrimination bit (bit8') has a true value "1", the switch 100 outputs the 8-bit serial data (bit0' to bit7') after inverting the even-numbered bits (bit0, bit2, bit4, and bit6) of the 8-bit serial data. If the discrimination bit (bit8') has a false value "0", the switch 100 outputs the 8-bit serial data (bit0' to bit7') without bit inversion.

The serial-to-parallel conversion circuit 7a receives the 8-bit serial data (bit0' to bit7') and converts the same to the 8-bit parallel data (bit0 to bit7).

With the decoder of the sixth embodiment, the 9-bit serial code outputted from the encoder according to the first, forth, or fifth embodiment is received. Thereafter, when the discrimination bit (bit8') included in the 9-bit serial code is true, the code deconversion circuit 9a deconverts the 8-bit data (bit0' to bit7') excluding the discrimination bit in such a way that the even-numbered bits (i.e., bit0', bit2', bit4', and bit6') are inverted. The serial-to-parallel conversion circuit 7a receives the 8-bit serial data (bit0' to bit7') outputted from the circuit 9a and converts the same to the 8-bit parallel data (bit0 to bit7).

The bit position at which the bit is inverted by the code deconversion circuit 9a needs to be equal to the bit position at which the bit is inverted by the code conversion circuit 3 or 3a in the encoder of the first, fourth, or fifth embodiment. Thus, the 9-bit serial code transferred by the encoder of the first, fourth, or fifth embodiment can be decoded to the original 8-bit parallel data.

With regard to a concrete circuit configuration of the decoder according to the sixth embodiment of FIG. 16, excluding the timing controlling circuit, the code deconversion circuit 9a can be formed by a group of gates for separating the 8-bit serial data and the discrimination bit from the inputted 9-bit serial code and outputting the same, a shift register for successively outputting the 8-bit serial data, two flip-flops for holding the discrimination bit, a counter for outputting a parity signal, a two-input AND gate, a NOT gate for bit inversion, and a two-input switch for switching between conversion and non-conversion.

In this way, unlike the decoder of the second embodiment, the 9-bit serial code is processed. Accordingly, necessary circuit components or elements will be larger than the second embodiment. Nonetheless, the decoder of to the sixth embodiment that decodes an EMI-suppressed 9-bit serial code can be realized with much less circuit components or elements than those of the first prior-art system using the look-up tables. This means that the fabrication cost of the decoder can be lowered.

Seventh Embodiment

FIG. 17 is a functional block diagram showing the circuit configuration of a data transfer system according to a seventh embodiment of the invention.

As shown in FIG. 17, the data transfer system comprises a data transmission circuit 110a, a data reception circuit 120a, and a transmission channel or line 130. The data transmission circuit 110a includes an encoder 111a having the same circuit configuration as that of the above-described encoder according to the fifth embodiment of FIG. 15. The data reception circuit 120a includes a decoder 122a having the same circuit configuration as that of the above-described decoder according to the sixth embodiment of FIG. 15.

In the encoder 11a of the data transmission circuit 110a, the changing-point counting circuit 1a counts the changing points of the 8-bit serial data (bit0 to bit7) to generate a counting result. The circuit 1a outputs the discrimination bit (bit8'), which is true when the counting result exceeds a predetermined value of 3. The code conversion circuit 3a converts the 8-bit serial data (bit0 to bit7) in such a way that the even-numbered bits (i.e., bit0, bit2, bit4, and bit6) are inverted when the discrimination bit (bit8') is true. Moreover, the circuit 3a adds the discrimination bit (bit8') to the code-inverted 8-bit serial data (bit0' to bit7') as its MSB, thereby generating and outputting the 9-bit serial data (bit0' to bit8').

The 9-bit serial code (bit0' to bit8') thus generated is outputted to the transmission line 130 by way of an output circuit 112. The output circuit 112 comprises an output buffer and a control circuit for controlling the data transmission operation.

In the data reception circuit 120a, the decoder 122a receives the 9-bit serial code (bit0' to bit8') from the transmission line 130 by way of an input circuit 121. The code deconversion circuit 9a deconverts the 9-bit serial data thus received in such a way that the even-numbered bits (i.e., bit0', bit2', bit4', and bit6') excluding the discrimination bit (bit8') are inverted when the discrimination bit bit8' is true. Thus, the circuit 9a outputs the 8-bit serial data (bit0 to bit7) to the serial-to-parallel conversion circuit 7a. The circuit 7a converts the 8-bit serial code (bit0 to bit7) to the 8-bit parallel data, resulting in the original 8-bit With the data transfer system according to the seventh embodiment of FIG. 17, as explained above, the data transmission circuit 110a outputs the 9-bit serial code having decreased changing points (which is generated from the original 8-bit parallel data), and the data reception circuit 120a receives the 9-bit serial code and decodes the same to the original 8-bit parallel data. Therefore, the high-frequency components of the 9-bit serial code occurring in the serial transmission operation are reduced, thereby effectively suppressing EMI.

Moreover, the encoder 111a of the data transmission circuit 110a and the decoder 122a of the data reception circuit 120a can be realized with much less circuit components or elements than those of the first prior-art system using the look-up tables. Thus, the fabrication cost of the data transfer system according to the seventh embodiment can be lowered.

In the encoder, decoder, and the data transfer system according to the fifth to seventh embodiments, respectively, the discrimination bit (bit8') is located at the MSB of the 9-bit serial code. However, it may be located at the LSB of the 9-bit serial code.

Eighth Embodiment

Figure 18:
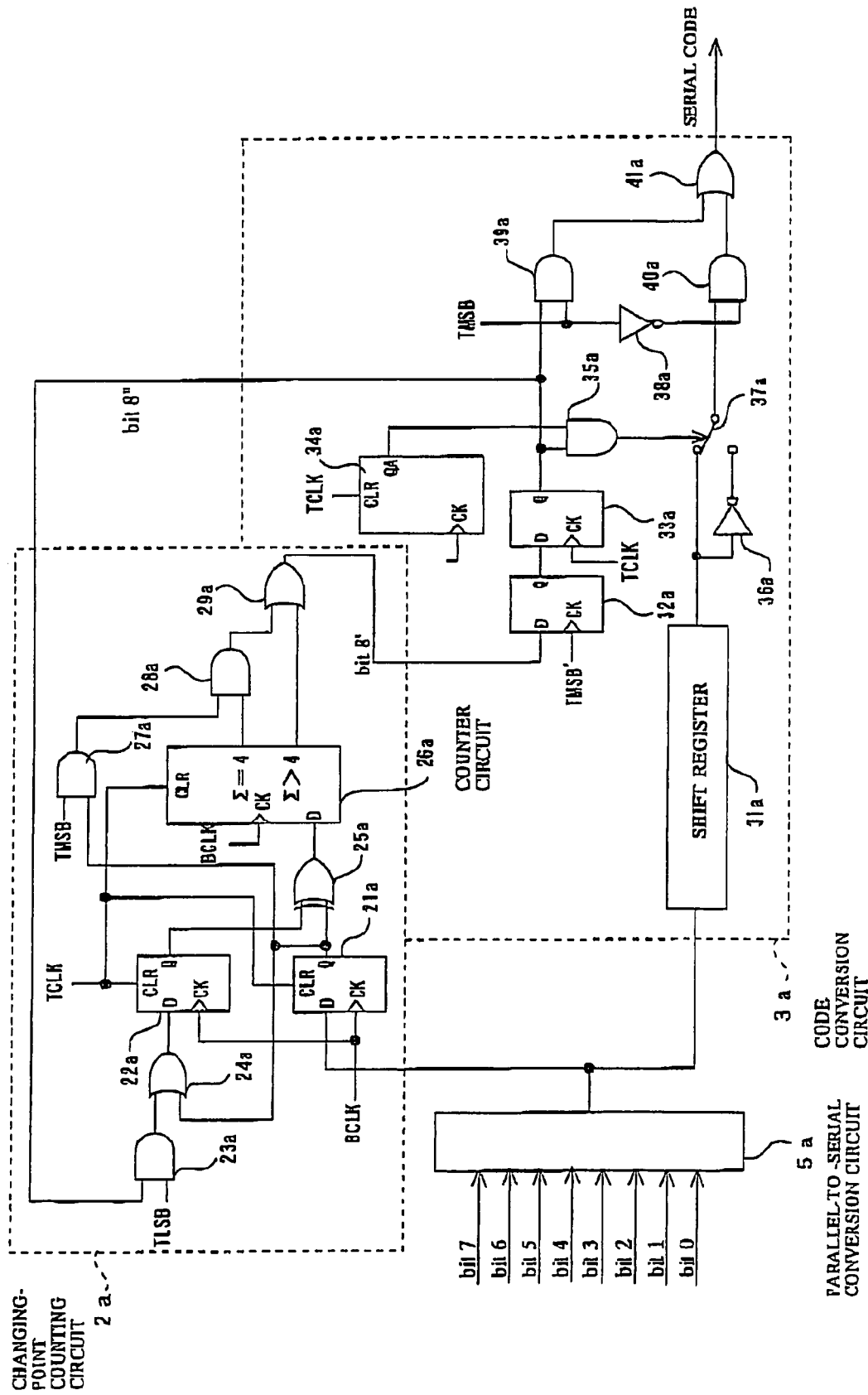
FIG. 18 is a functional block diagram showing the circuit configuration of an encoder according to an eighth embodiment of the invention.

FIG. 18 is a functional block diagram showing the circuit configuration of an encoder according to an eighth embodiment of the invention. As explained above, in the encoder of the fourth embodiment of FIG. 11, specific modification is applied to the encoder of the first embodiment of FIG. 2. The same modification as that applied to the first embodiment is applied to the fifth embodiment of FIG. 15, thereby forming the encoder of the eighth embodiment.

As shown in FIG. 18, the encoder of the eighth embodiment comprises a changing-point counting circuit 2a, a code conversion circuit 3a, and a parallel-to-serial conversion circuit 5a. Since the code conversion circuit 3a and the parallel-to-serial conversion circuit 5a used here are the same in circuit configuration and operation as those of the encoder according to the fifth embodiment of FIG. 15, the explanation for them is omitted for the sake of simplification. Thus, the changing-point counting circuit 2a will be explained in detail below.

In the encoder of the eighth embodiment, like the fifth embodiment, the processes are applied to the 8-bit "serial" code and therefore, they need to be carried out in two different stages, i.e., the first and second time stages.

Thus, a "transfer period clock TCLK" is applied as the timing signal for defining the first or second time stage, a "bit clock BCLK" is applied as the timing signal for defining bit processing time per bit, a signal TLSB for showing the processing time for the LSB of the 8-bit data in one time stage is applied, and a signal TMSB for showing the processing time for the MSB of the 8-bit data in one time stage is also applied.

The changing-point counting circuit 2a includes two flip-flops 21a and 22a for holding the adjoining bits, a two-input AND gate 23a and two-input OR gate 24a for inputting the discrimination bit (bit8") in the prior time stage into the flip-flop 22a in the LSB processing time, a two-input EXOR gate 25a for changing-point detection, a counter circuit 26a for counting the changing points, and two two-input AND gates 27a and 28a and a two-input OR gate 29a for setting the discrimination bit (bit8') true when the counting result is equal to the predetermined value of 4, and the MSB (i.e., bit 7) of the 8-bit data serial data (bit0 to bit7) has a true value "1".In the changing-point counting circuit 2a, like the fifth embodiment, the flip-flops 21a and 22a receive successively the 8-bit serial data (bit0 to bit7) and the dummy bit according to the bit clock BCLK. Thus, in the bit processing time excluding the LSB processing time, the two adjoining bits (i.e., bit0 and bit1, bit1 and bit2, bit2 and bit3, bit3 and bit4, bit4 and bit5, bit5 and bit6, and bit6 and bit7) of the 8-bit data are held, respectively, thereby detecting whether the two adjoining bits have different values or not. The EXOR gate 25*a* conducts an EXOR operation between the outputs of the flip-flops 21*a* and 22*a*, thereby detecting the count of the changing points for the 8-bit serial data (bit0 to bit7).

On the other hand, in the LSB processing time, the LSB (bit0) of the 8-bit serial data is inputted into the flip-flop 21*a* while the discrimination bit (bit8") (i.e., the output of the flip-flop 33*a* of the code conversion circuit 3*a*) used in the preceding time stage is inputted into the flip-flop 22*a* by way of the AND gate 23*a* and the OR gate 24*a*. Then, the outputs of the flip-flops 21*a* and 22*a* is subjected to an EXOR operation by the EXOR gate 25*a*. Thus, whether or not a changing point occurs in the bit boundary between the LSB (bit0) and the discrimination bit (bit8") can be detected.

The counter circuit 26*a* counts the output of the EXOR gate 25*a* up in each bit processing time according to the bit clock BCLK. In other words, the circuit 26*a* receives the 9-bit serial data as the detection target data and counts the changing points of the said data, thereby outputting two counting result signals $\Sigma>4$ and $\Sigma=4$ according to the counting result. The counting result signal $\Sigma>4$ has a true value "1" when the counting result has a value exceeding the predetermined value of 4. The counting result signal $\Sigma=4$ has a true value "1" when the counting result has a value equal to the predetermined value of 4. This is easily realized, for example, the third digit of the output of the counter 26*a* is defined as the signal $\Sigma=4$ and at the same time, the logic sum of the third and fourth digits of the output of the counter 26*a* is defined as the signal $\Sigma>4$.

The AND gate 27*a* conducts an AND operation between the output of the flip-flop 21*a* and the signal showing the MSB processing time to produce the MSB (bit7) of the 8-bit serial data. The AND gate 28*a* conducts an AND operation between the MSB (bit7) of the 8-bit serial data and the counting result signal $\Sigma=4$ of the counter 26*a*. The OR gate 29*a* conducts a logic OR operation between the output of the AND gate 28*a* and the counting result signal $\Sigma>4$ of the counter 26*a*.

In this way, the discrimination bit (bit8') is true when the counting result of the changing points for the detection target data (i.e., the 9-bit serial data) has a value exceeding the predetermined value of 4, or when the counting result has a value equal to the predetermined value of 4 and the MSB (bit7) of the 8-bit serial data is true.

With the encoder according to the eighth embodiment of FIG. 18, the 9-bit data formed by the 8-bit data (bit0 to bit7) and the discrimination bit (bit8") is used as the detection target data of the changing-point counting circuit 2*a*. The predetermined value M' for the changing-point counting circuit 2*a* is set at 4, which is the largest integer in the range of 4.0 [=(½)n] or less. Moreover, the discrimination bit (bit8') is set to be true when the counting result of the 9-bit detection target data exceeds the predetermined value of 4, or when the counting result is equal to the predetermined value of 4 and the MSB (i.e., bit 7) of the 8-bit data (bit0 to bit7) has a true value "1". When the discrimination bit (bit8') is set to be true, the even-numbered bits (i.e., bit0, bit2, bit4, and bit6) of the 8-bit data (bit0 to bit7) are inverted while the odd-numbered bits (i.e., bit1, bit3, bit5, and bit7) thereof are not inverted.

Thus, like the fourth embodiment, the count of the changing points of the 8-bit serial data (bit0' to bit7') (i.e., the output of the code conversion circuit 3*a*) to M' 4 at most. The count of the changing points of the 9-bit serial code (bit0, to bit8)' for the transfer unit is reduced to M'=4 at most. As a result, because the changing point occurring at the transfer data boundary is included into the reduction target data for the changing points, the suppression of EMI over the whole transmission data can be surely realized by way of reducing the count of the changing points for the data itself and the added information (i.e., discrimination bit).

With regard to a concrete circuit configuration of the encoder of the eighth embodiment of FIG. 18, unlike the encoder of the fourth embodiment of FIG. 11, the 8-bit serial code is processed. Thus, the processes by the changing-point counting circuit 2*a* and the code conversion circuit 3*a* need to be carried out in two different stages (i.e., the first and second time stage) and moreover, timing control for each bit needs to be conducted in each of these two stages. Accordingly, necessary circuit components or elements will be larger than the fourth embodiment. Nonetheless, the encoder of to the eighth embodiment can be realized with much less circuit components or elements than those of the first prior-art system using the look-up tables. This means that the fabrication cost of the decoder can be lowered.

In the above-described encoders of the fifth and eighth embodiments, when the discrimination bit (bit8') is true, the code conversion circuit 3*a* inverts the even-numbered bits (i.e., bit0, bit2, bit4, and bit6) of the 8-bit data (bit0 to bit7) are inverted. However, the circuit 3*a* may invert the odd-numbered bits (i.e., bit1, bit3, bits, and bit7) of the 8-bit data (bit0 to bit7).

In the above-described decoder of the second embodiment, when the discrimination bit (bit8') is true, the code deconversion circuit 9*a* inverts the even-numbered bits (i.e., bit0', bit2', bit4', and bit6') of the 9-bit data (bit0' to bit7') excluding the discrimination bit (bit8'). However, the circuit 9*a* may invert the odd-numbered bits (i.e., bit1', bit3', bit5', and bit7') of the 9-bit data (bit0' to bit8').

When these encoders and decoders are used in combination in a similar way as the data transfer system according to the seventh embodiment of FIG. 17, the bit inversion positions need to be accorded between the encoder and the decoder used.

In the data transfer system according to the third embodiment of FIG. 10, the data transmission circuit 110 includes the encoder 111 having the same circuit configuration as that of the above-described encoder of the first or fourth embodiment. The data reception circuit 120 includes the decoder 122 having the same circuit configuration as that of the above-described decoder of the second embodiment. In the data transfer system according to the seventh embodiment of FIG. 17, the data transmission circuit 110*a* includes the encoder 111*a* having the same circuit configuration as that of the above-described encoder of the fifth or eighth embodiment.

The data reception circuit 120*a* includes the decoder 122*a* having the same circuit configuration as that of the above-described decoder of the sixth embodiment. However, the invention is not limited to these examples. Any one of the encoders of the first, fourth, fifth, and eighth embodiments and any one of the decoders of the second or sixth embodiments may be used in combination. This means that the combination of the encoder and the decoder is optional.

Ninth Embodiment

Figure 19:
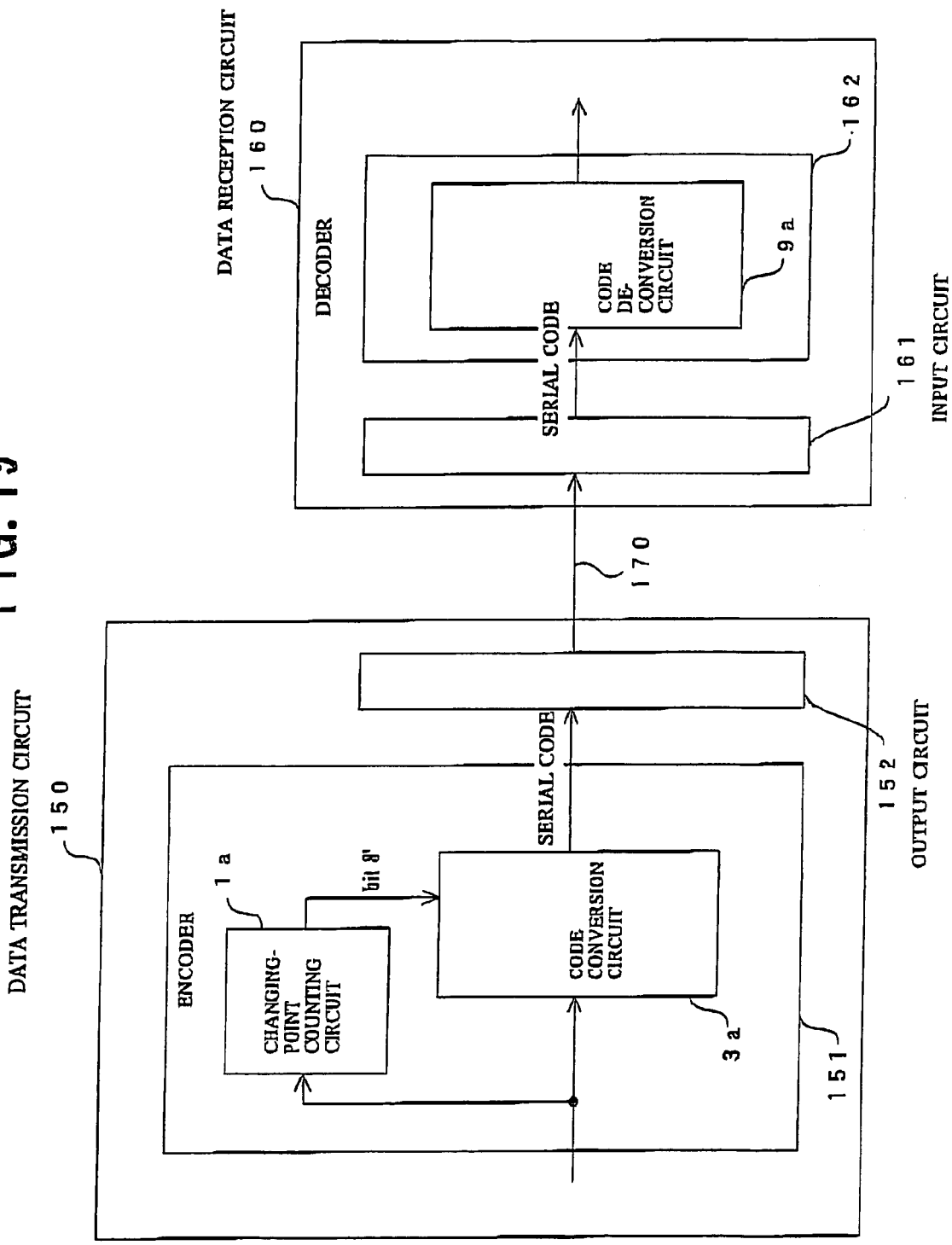
FIG. 19 is a functional block diagram showing the circuit configuration of a data transfer system according to a ninth embodiment of the invention.

FIG. 19 is a functional block diagram showing the circuit configuration of a data transfer system according to a ninth embodiment of the invention.

As shown in FIG. 19, the data transfer system comprises a data transmission circuit 150, a data reception circuit 160, and a transmission channel or line 170. The data transmission circuit 150 includes an encoder 151 and an output circuit 152.

The data reception circuit 160 includes an input circuit 161 20 and a decoder 162.

The encoder 151 of the data transmission circuit 150 comprises a changing-point counting circuit 1a and a code conversion circuit 3a. This circuit configuration is the same as that obtained by removing the parallel-to-serial conversion circuit 5a from the above-described encoder according to the fifth embodiment of FIG. 14. Since the difference between the encoder 151 used in the ninth embodiment and the encoder of the fifth embodiment is input of the 8-bit "serial" data instead of the 8-bit "parallel" data, the detailed explanation about the circuit configuration and operation about the encoder 151 is omitted here.

The decoder 162 of the data reception circuit 160 comprises a code deconversion circuit 9a. This circuit configuration is the same as that obtained by removing the serial-to-parallel conversion circuit 7a from the above-described decoder according to the sixth embodiment of FIG. 15. Since the difference between the decoder 162 used in the ninth embodiment and the encoder of the sixth embodiment is output of the 8-bit "serial" data instead of the 8-bit "parallel" data, the detailed explanation about the circuit configuration and operation of the decoder 162 is omitted here.

In the encoder 151 of the data transmission circuit 150, the changing-point counting circuit 1a counts the changing points of the 8-bit serial data (bit0 to bit7) to generate a counting result, where values of the adjoining bits change at each of the changing points. The circuit 1a outputs the discrimination bit (bit8'), which is true when the counting result exceeds a predetermined value of 3. The code conversion circuit 3a converts the 8-bit serial data (bit0 to bit7) in such a way that the even-numbered bits (i.e., bit0, bit2, bit4, and bit6) of the data (bit0 to bit7) are inverted when the discrimination bit bit8' is true. The circuit 3a generates and outputs the 9-bit serial code (bit0' to bit8') by adding the discrimination bit (bit8') to the output of the code conversion circuit 3a [i.e., the 8-bit serial data (bit0' to bit7')] as its MSB. The 9-bit serial code (bit1' to bit8') is outputted to the transmission line 170 by way of the output circuit 152. The output circuit 152 comprises an output buffer and a control circuit for controlling the data transmission operation.

On the other hand, in the data reception circuit 160, the decoder 162 receives the 9-bit serial code (bit0' to bit8') from the transmission line 170 by way of an input circuit 161. The code deconversion circuit 9a of the decoder 162 deconverts the 9-bit serial code (bit0' to bit8') in such a way that the even-numbered bits (i.e., bit0', bit2', bit4', and bit6') of the code (bit0' to bit8') excluding the discrimination bit (bit8') are inverted when the added discrimination bit (bit8') is true. Thus, the original 8-bit serial data (bit0 to bit7) are generated, in other words, the 9-bit serial code (bit0' to bit8') received is decoded to the original 8-bit serial data (bit0 to bit7).

With the data transfer system according to the ninth embodiment of FIG. 19, as explained above, the data transmission circuit 150 outputs the 9-bit serial code (bit0' to bit8') having decreased changing points, and the data reception circuit 160 receives the 9-bit serial code (bit0' to bit8') and decodes the same to the original 8-bit data (bit0 to bit7). Therefore, the high-frequency components of the 9-bit serial code (bit0' to bit8') occurring in the serial transmission operation are reduced, thereby effectively suppressing EMI.

Moreover, the encoder 151 of the data transmission circuit 150 and the decoder 162 of the data reception circuit 160 can be realized with much less circuit components or elements than those of the first prior-art system using the look-up tables. Thus, the fabrication cost of the data transfer system according to the ninth embodiment can be lowered.

Although the discrimination bit (bit8') is added to the 8-bit data (bit0' to bit7') outputted from the code conversion circuit 3a as its MSB in the encoder 151, the invention is not limited to this. The discrimination bit (bit8') may be added to the 8-bit data (bit0' to bit7') as its LSB.

In the data transfer system according to the ninth embodiment of FIG. 19, the encoder 151 of the data transmission circuit 150 includes the changing-point counting circuit 1a and the code conversion circuit 3a which are used in the above-described fifth embodiment of FIG. 15. However, the changing-point counting circuit 2a and the code conversion circuit 3a used in the encoder of the above-described seventh embodiment of FIG. 17 may be used for this purpose. In this case, because the changing point occurring at the transfer data boundary is included into the reduction target data for the changing points, the suppression of EMI over the whole transmission data can be surely realized by way of reducing the count of the changing points for the data itself and the added information (i.e., discrimination bit).

Other Embodiments

It is needless to say that the present invention is not limited to the above-described first to ninth embodiments. Any modification is applicable to these embodiments.

While the preferred forms of the present invention have been described, it is to be understood that modifications will be apparent to those skilled in the art without departing from the spirit of the invention. The scope of the present invention, therefore, is to be determined solely by the following claims.

The invention claimed is:

1. A decoder comprising:
   a serial-to-parallel converter for converting an (n+1)-bit serial code generated by an encoder to a (n+1)-bit parallel data;
   the encoder including,
   a changing-point counter for counting changing points of n-bit data (n: a positive integer) to generate a counting result, where values of adjoining bits change at each of the changing points,
   the changing-point counter outputting a discrimination bit which has a first valve when the counting result exceeds a predetermined value,
   a code converter for converting the n-bit data in such a way that bits of the n-bit data located at predetermined positions are inverted when the discrimination bit has the first valve,
   a parallel-to-serial converter for converting (n+1)-bit data to a (n+1)-bit serial code, the (n+1)-bit data being generated by adding the discrimination bit to an output of the code converter; and
   a code deconverter for deconverting the (n+1)-bit parallel data in such a way that some of the n-bits of the (n+1)-bit parallel data located at predetermined positions excluding the discrimination bit are inverted when the discrimination bit is true.

2. A decoder comprising:

a code deconverter for inverting an (n+1)-bit serial code generated by an encoder in such a way that some of the n-bits of the (n+1)-bit serial code located at predetermined positions excluding the discrimination bit are inverted when the discrimination bit is true, thereby outputting a n-bit serial data, the encoder including, a changing-point counter for counting changing points of n-bit data(n: a positive integer) to generate a counting result, where values of adjoining bits change at each of the changing points, the changing-point counter outputting a discrimination bit which has a first valve when the counting result exceeds a predetermined value, a code converter for converting the n-bit data in such a way that bits of the n-bit data located at predetermined positions are inverted when the discrimination bit has the first valve, a parallel-to-serial converter for converting (n+1)-bit data to a (n+1)-bit serial code, the (n+1)-bit data being generated by adding the discrimination bit to an output of the code converter; and a serial-toparallel converter for converting the n-bit serial data to a n-bit parallel data.

* * * * *